United States Patent
Arayashiki

(10) Patent No.: US 9,985,205 B2
(45) Date of Patent: May 29, 2018

(54) LAYERED CROSS-POINT SEMICONDUCTOR MEMORY DEVICE

(71) Applicant: Toshiba Memory Corporation, Minato-ku (JP)

(72) Inventor: Yusuke Arayashiki, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days. days.

(21) Appl. No.: 15/061,328

(22) Filed: Mar. 4, 2016

(65) Prior Publication Data
US 2017/0077398 A1 Mar. 16, 2017

Related U.S. Application Data

(60) Provisional application No. 62/216,847, filed on Sep. 10, 2015.

(51) Int. Cl.
*H01L 27/24* (2006.01)
*H01L 45/00* (2006.01)
*H01L 27/118* (2006.01)

(52) U.S. Cl.
CPC ........ *H01L 45/145* (2013.01); *H01L 27/2481* (2013.01); *H01L 45/04* (2013.01); *H01L 45/085* (2013.01); *H01L 45/1233* (2013.01); *H01L 45/1253* (2013.01); *H01L 45/1266* (2013.01); *H01L 45/146* (2013.01); *H01L 45/148* (2013.01); *H01L 45/16* (2013.01); *G11C 2207/105* (2013.01); *H01L 2027/11885* (2013.01); *H01L 2027/11887* (2013.01); *H01L 2224/05553* (2013.01); *H01L 2224/05554* (2013.01)

(58) Field of Classification Search
CPC . H01L 2027/11885; H01L 2027/11888; H01L 2027/11887; H01L 27/11286; H01L 27/2481; H01L 27/2463; H01L 27/118; H01L 2224/05554; G11C 2207/105
See application file for complete search history.

(56) References Cited

U.S. PATENT DOCUMENTS

| 8,115,586 B2 | 2/2012 | Hosoi et al. |
| 8,648,467 B2 | 2/2014 | Baba |
| 8,822,968 B2 | 9/2014 | Inokuma |

(Continued)

*Primary Examiner* — Jesse Y Miyoshi
*Assistant Examiner* — Gustavo Ramallo
(74) *Attorney, Agent, or Firm* — Oblon, McClelland, Maier & Neustadt, L.L.P.

(57) ABSTRACT

According to one embodiment, a semiconductor memory device includes first and second interconnect parts, and a second interconnect connection part. The first interconnect part includes a first core part, and a first interconnect layer. The first interconnect layer includes a first surrounding region and a first extended region. The second interconnect part includes a second core part, and a second interconnect layer. The second interconnect layer includes a second surrounding region and a second extended region. The second extended connection part overlaps a part of the first extended region in the third direction, overlaps the second core part in the first direction, and is electrically connected to the second core part. The second extended surrounding part is provided around the second extended connection part and contains a material contained in the first surrounding region.

11 Claims, 24 Drawing Sheets

(56) References Cited

U.S. PATENT DOCUMENTS

| | | |
|---|---|---|
| 2009/0096568 A1 | 4/2009 | Hosoi et al. |
| 2013/0064001 A1 | 3/2013 | Terai |
| 2013/0248796 A1 | 9/2013 | Inokuma |
| 2014/0264246 A1* | 9/2014 | Walls .................. H01L 45/1253 257/4 |
| 2014/0312294 A1* | 10/2014 | Lee .................... H01L 27/2481 257/4 |

* cited by examiner

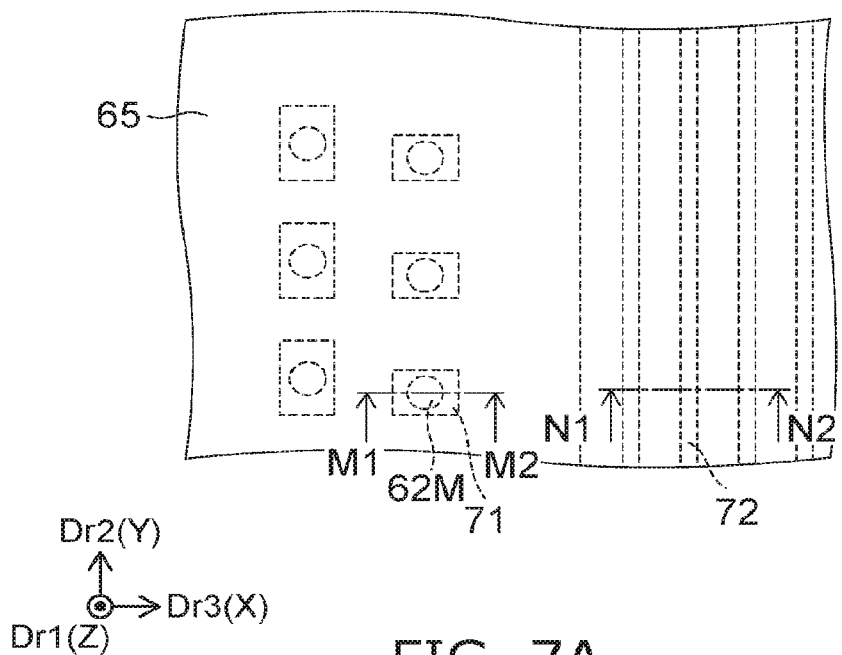
FIG. 7A
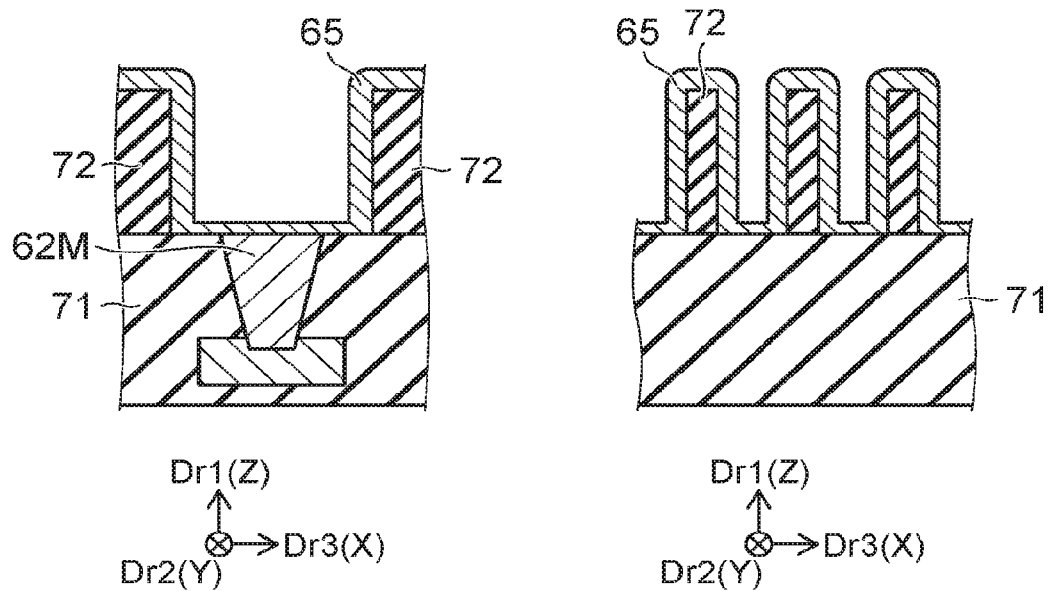
FIG. 7B
FIG. 7C

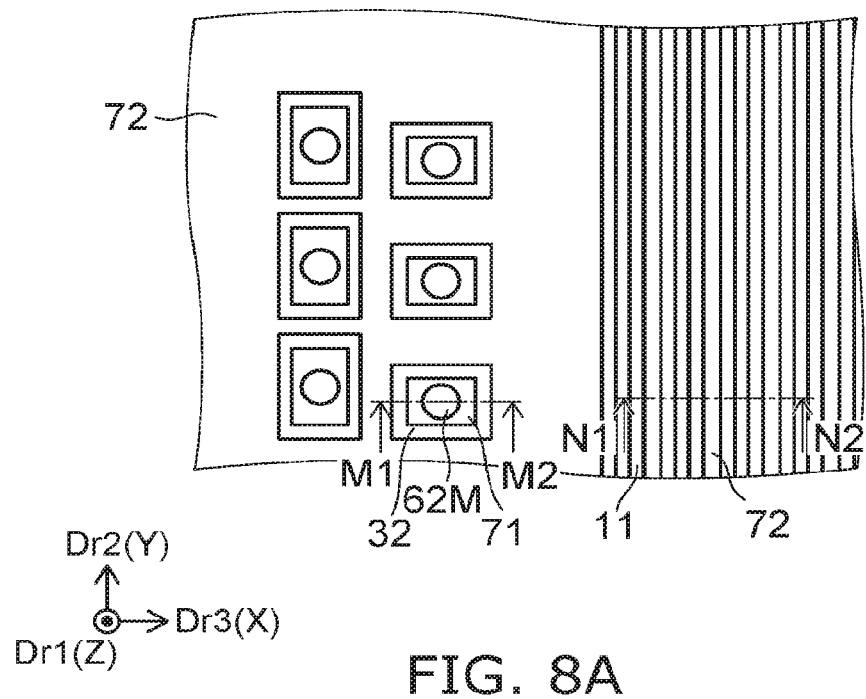
FIG. 8A
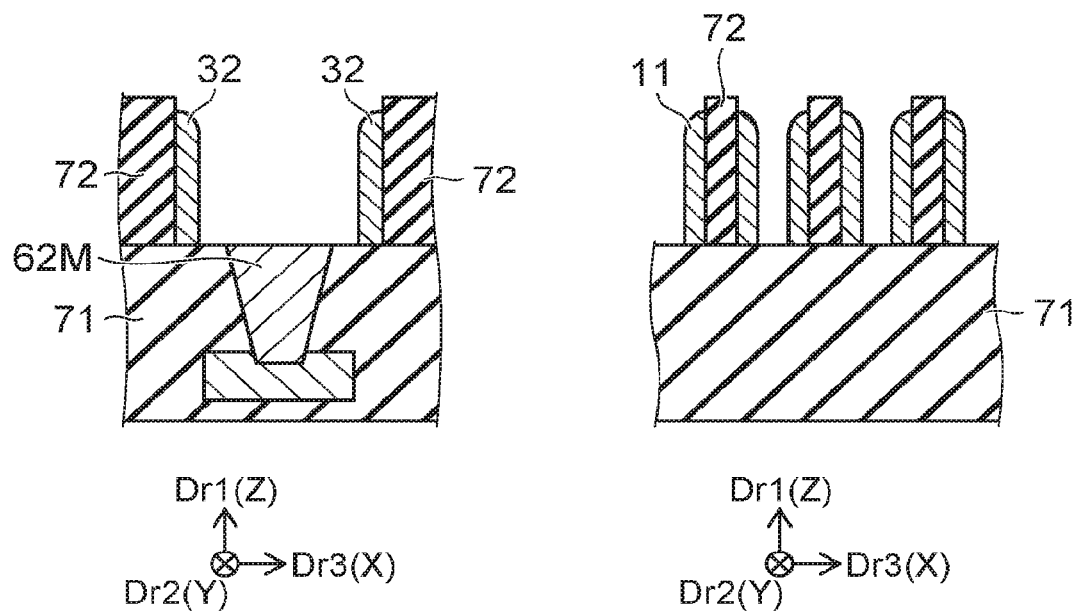
FIG. 8B
FIG. 8C

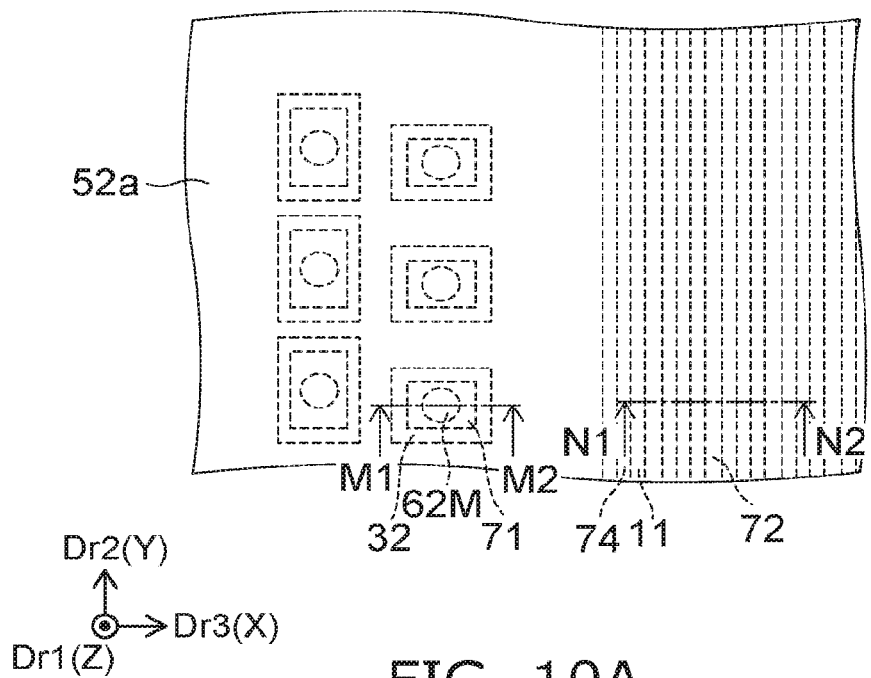
FIG. 10A
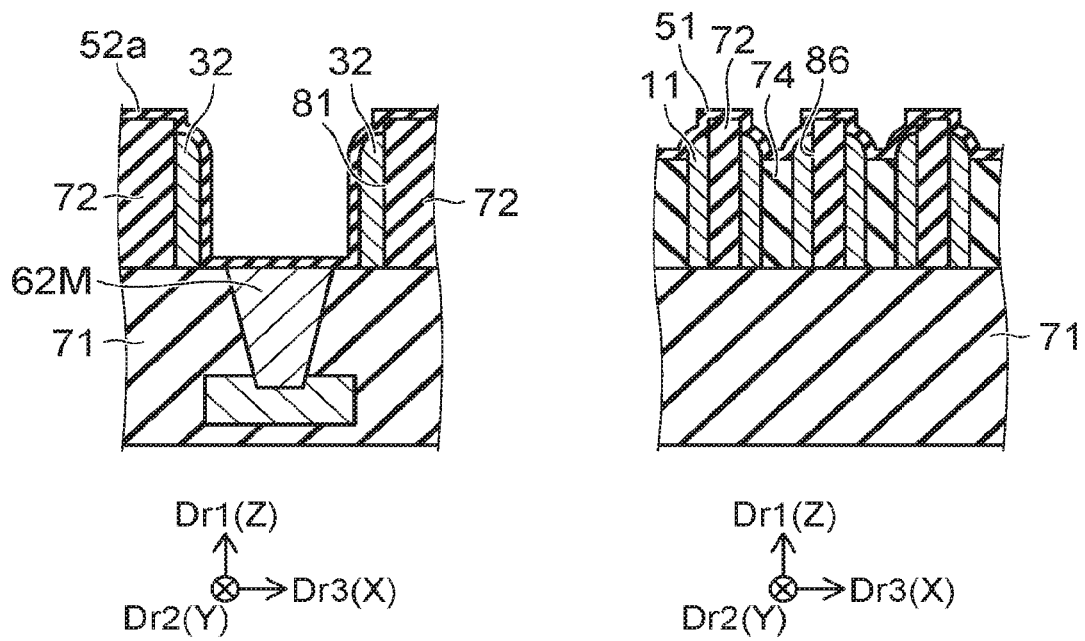
FIG. 10B
FIG. 10C

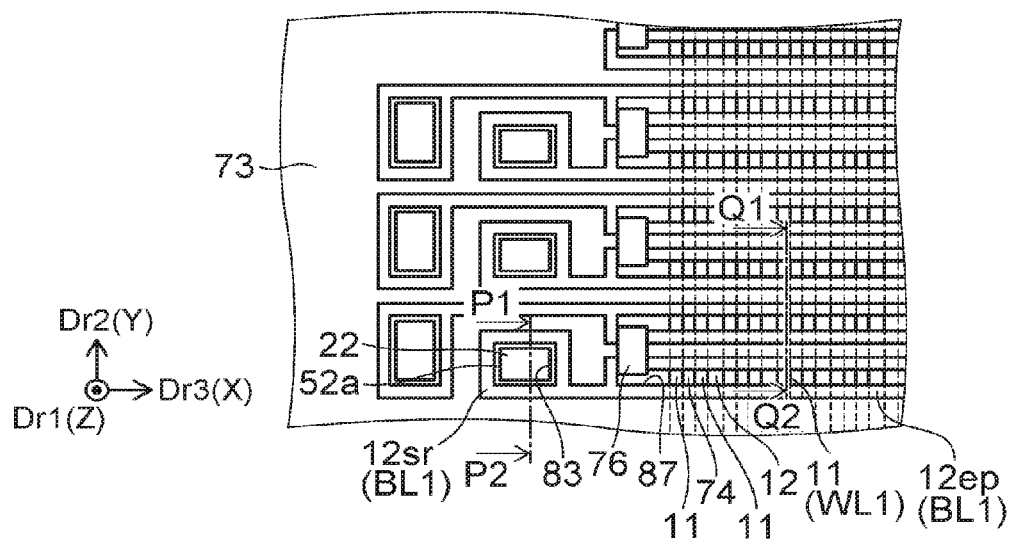
FIG. 15A
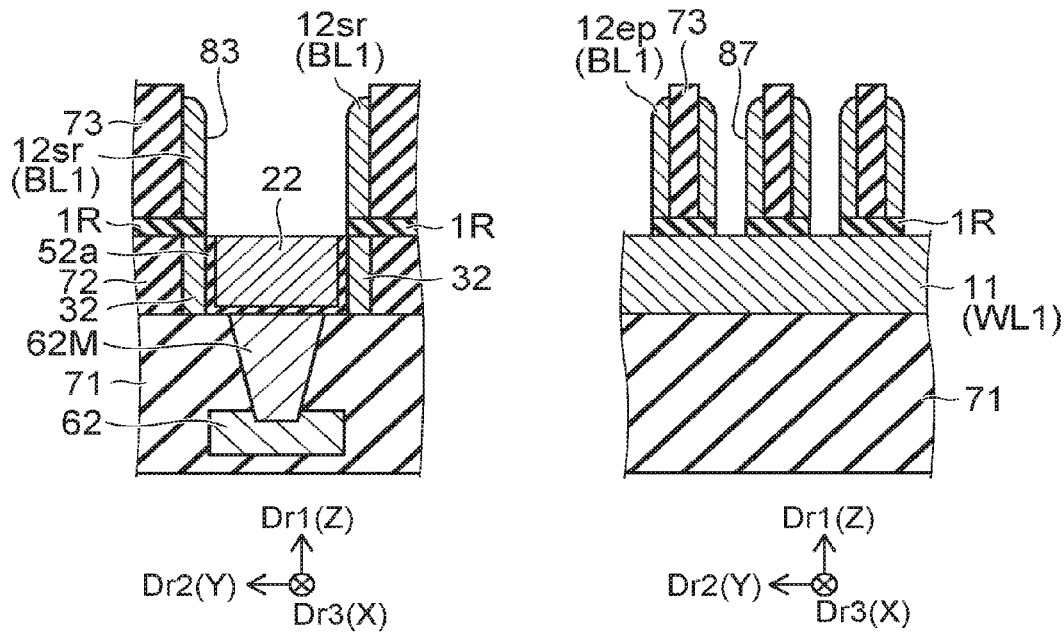
FIG. 15B
FIG. 15C

LAYERED CROSS-POINT
SEMICONDUCTOR MEMORY DEVICE

CROSS-REFERENCE TO RELATED
APPLICATIONS

This application is based upon and claims the benefit of priority from U.S. Provisional Patent Application 62/216,847, filed on Sep. 10, 2015; the entire contents of which are incorporated herein by reference.

FIELD

Embodiments relates to a semiconductor memory device and a method for manufacturing the same.

BACKGROUND

A cross-point type semiconductor memory device is proposed, which includes a first interconnect layer, a second interconnect layer, and a resistance change layer provided therebetween.

BRIEF DESCRIPTION OF THE DRAWINGS

FIG. 6A to FIG. 6C, FIG. 7A to FIG. 7C, FIG. 8A to FIG. 8C, FIG. 9A to FIG. 9C, FIG. 10A to FIG. 10C, FIG. 11A to FIG. 11C, FIG. 12A to FIG. 12C, FIG. 13A to FIG. 13E, FIG. 14A, FIG. 14B, FIG. 15A to FIG. 15C, FIG. 16A to FIG. 16C, FIG. 17A to FIG. 17C, FIG. 18A, FIG. 18B, FIG. 19A to FIG. 19F, FIG. 20A to FIG. 20F, FIG. 21A to FIG. 21D, FIG. 22A, FIG. 22B are schematic views illustrating the method for manufacturing the semiconductor memory device according to the embodiment.

DETAILED DESCRIPTION

Figure 1:
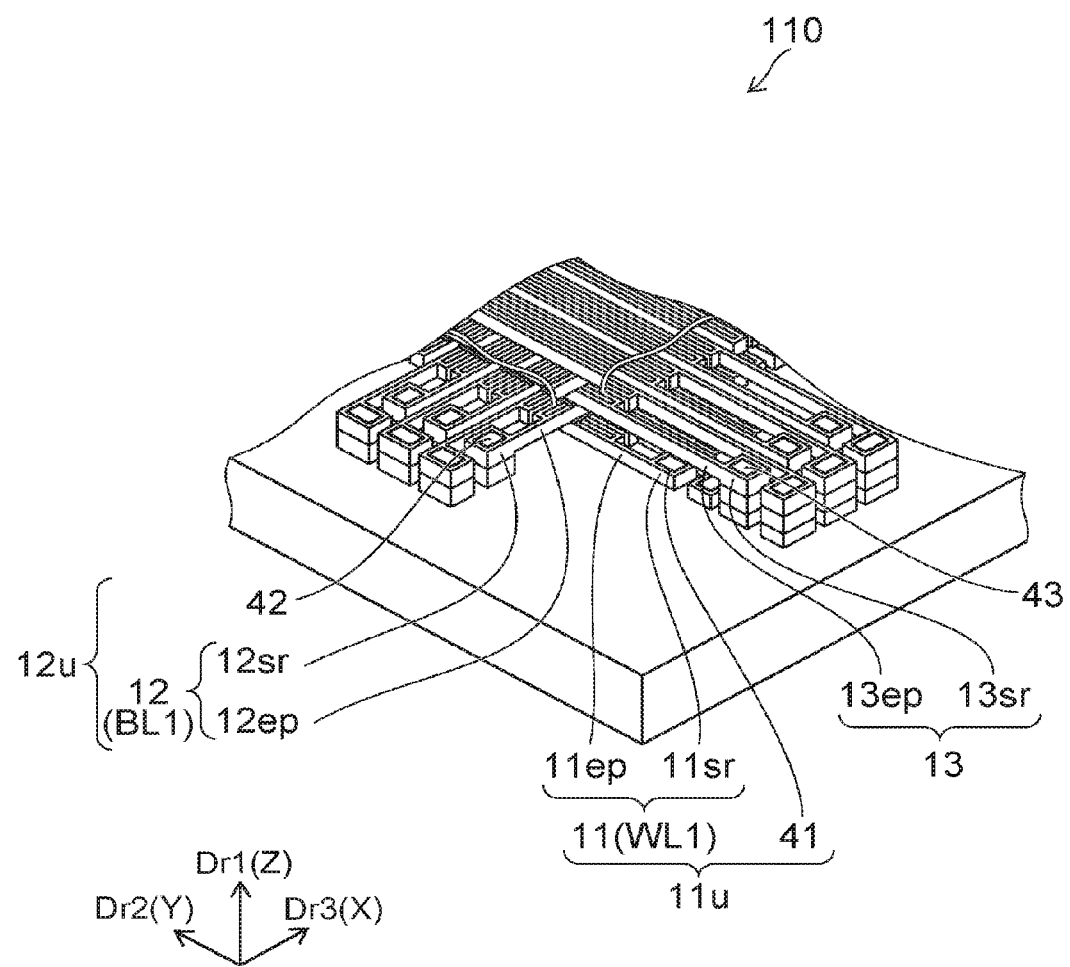
FIG. 1 is a schematic perspective view illustrating a part of a semiconductor memory device according to an embodiment.

According to one embodiment, a semiconductor memory device includes a first interconnect part, a second interconnect part and a second interconnect connection part. The second interconnect part is separated from the first interconnect part in a first direction. The second interconnect connection part overlaps a part of the second interconnect part in the first direction. The first interconnect part includes a first core part, and a first interconnect layer. The first interconnect layer includes a first surrounding region and a first extended region. The first surrounding region is provided around the first core part. The first extended region is connected to the first surrounding region and extends in a second direction crossing the first direction. The second interconnect part includes a second core part, and a second interconnect layer. The second interconnect layer includes a second surrounding region and a second extended region. The second surrounding region is provided around the second core part. The second extended region is connected to the second surrounding region and extends in a third direction crossing the first direction and the second direction. The second interconnect connection part includes a second extended connection part and a second extended surrounding part. The second extended connection part overlaps a part of the first extended region in the third direction, overlaps the second core part in the first direction, and is electrically connected to the second core part. The second extended surrounding part is provided around the second extended connection part and contains a material contained in the first surrounding region.

According to one embodiment, a method for manufacturing a semiconductor memory device is disclosed. The method includes forming a second conductive part in a part of the first insulating layer, forming one other part of the first insulating layer in the part of the first insulating layer and in the second conductive part, forming a second conductive connection part in the one other part of the first insulating layer, and forming a second insulating layer on the one other part of the first insulating layer and on the second conductive connection part. The method further includes forming a first opening and a first groove by removing a part of the second insulating layer, forming a second extended surrounding part on an inner wall of the first opening, forming a first interconnect layer on a side wall of the first groove, and forming a fourth insulating layer by burying the first groove with an insulating material. The method further includes forming a second extended connection part by burying the first opening with a conductive material, forming a first resistance change layer on the first insulating layer, the second insulating layer, the fourth insulating layer, the second extended surrounding part, the second conductive connection part and the first interconnect layer, forming a third insulating layer by depositing an insulating material on the first resistance change layer, forming a second opening by removing a part of the third insulating layer, forming a second interconnect layer by depositing a conductive material on an inner wall of the second opening and separating the second opening into a third opening and a seventh opening, and forming a second core part by burying the third opening with a conductive material.

Embodiments of the invention will be described hereinafter with reference to the drawings.

The drawings are schematic and conceptual, and the relationships between the thickness and width of portions, the size ratio among portions, etc., are not necessarily the same as the actual values thereof. Further, the dimensions and proportions may be illustrated differently among drawings, even for identical portions.

In the present specification and drawings, the same elements as those described previously with reference to earlier figures are labeled with like reference numerals, and the detailed description thereof is omitted as appropriate.

Embodiment

FIG. 1 is a schematic perspective view illustrating a part of a semiconductor memory device according to an embodiment.

Figure 2:
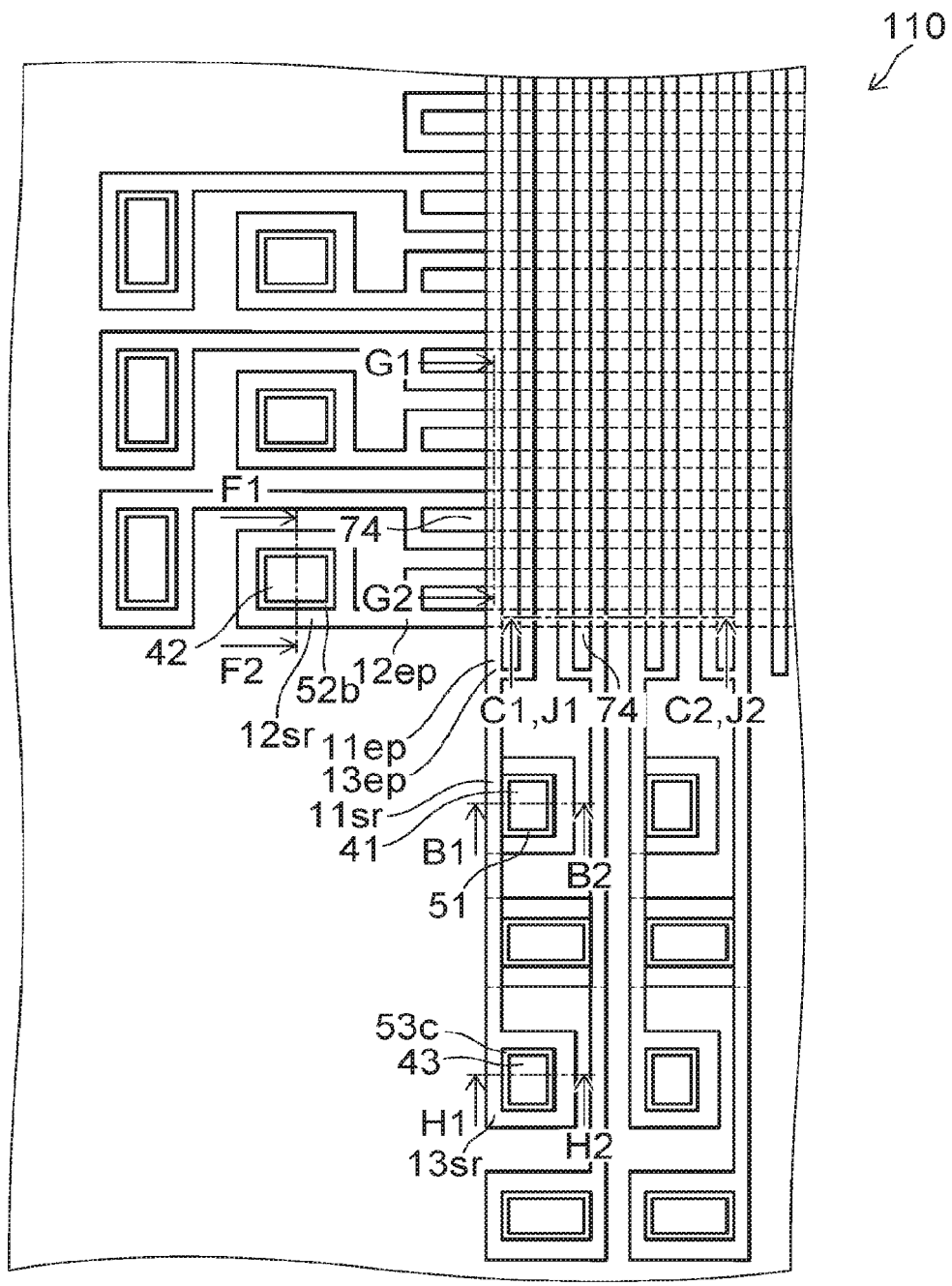
FIG. 2 is a schematic plan view illustrating a part of the semiconductor memory device according to the embodiment.

FIG. 2 is a schematic plan view illustrating a part of the semiconductor memory device according to the embodiment.

FIG. 3A to FIG. 3D are schematic views illustrating a part of the semiconductor memory device according to the embodiment.

Figure 3A:
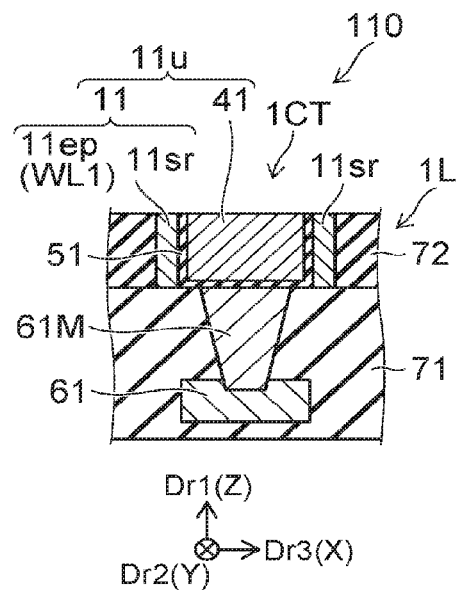
FIG. 3A to FIG. 3D are schematic views illustrating a part of the semiconductor memory device according to the embodiment.
Figure 3B:
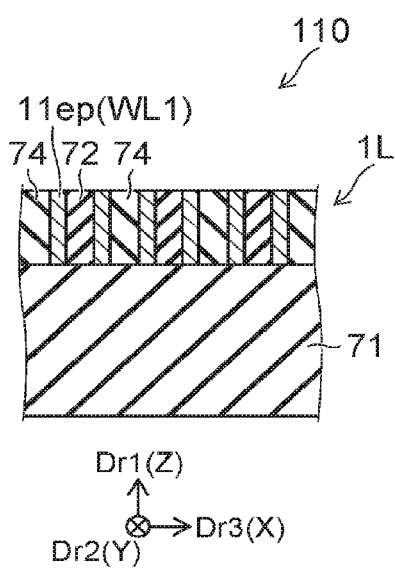
Figure 3C:
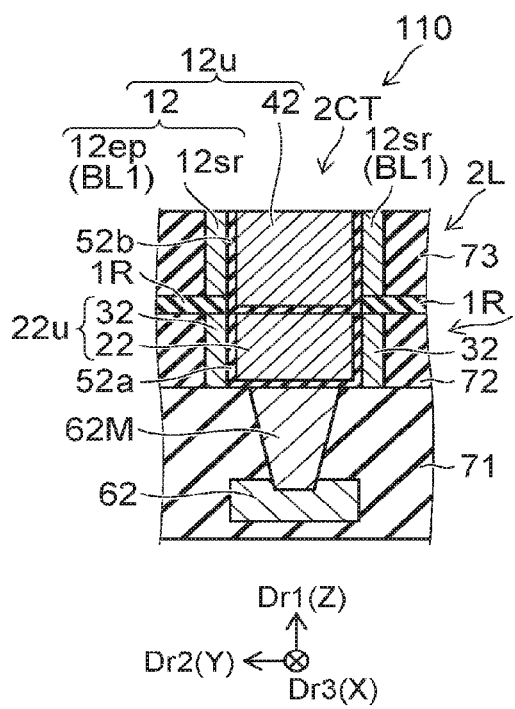
Figure 3D:
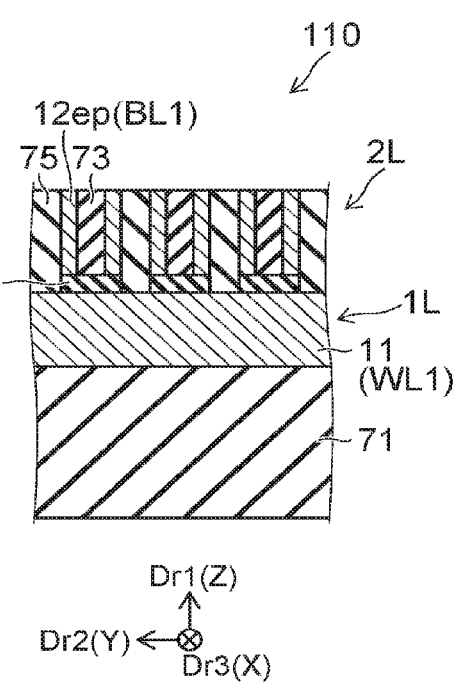

FIG. 3A is a sectional view along line B1-B2 of FIG. 2. FIG. 3B is a sectional view along line C1-C2 of FIG. 2. FIG. 3C is a sectional view along line F1-F2 of FIG. 2. FIG. 3D is a sectional view along line G1-G2 of FIG. 2.

The semiconductor memory device according to the embodiment is, for example, an OxRAM (Oxide-based Resistive Random Access Memory).

As shown in FIG. 1, FIG. 2, FIG. 3A and FIG. 3B, a semiconductor memory device 110 according to the embodiment includes an interconnect composed of plural layers, and a contact part. In the interconnect composed of the plural layers, an interconnect of a first layer 1L is, for example, a first interconnect layer 11. An interconnect layer of a second layer 2L is, for example, a second interconnect layer 12. The first interconnect layer 11 and the second interconnect layer 12 cross each other. A second conductive part 62 is provided in a layer lower than the first interconnect layer 11. A contact part (second contact part 2CT) includes, for example, a second core part 42 and a second extended connection part 22. The contact part (second contact part 2CT) connects, for example, a side wall interconnect (second surrounding region 12sr) of the upper layer interconnect layer (second interconnect layer 12) and the lower layer interconnect layer (second conductive part 62) through a second conductive connection part 62M. The interconnect is, for example, a metal interconnect.

The semiconductor memory device 110 according to the embodiment includes a first interconnect part 11u, a second interconnect part 12u, and a second interconnect connection part 22u. The second interconnect part 12u is separate from the first interconnect part 11u in a first direction Dr1.

The first interconnect part 11u includes a first core part 41 and the first interconnect layer 11. The first interconnect layer 11 includes a first surrounding region 11sr and a first extended region 11ep. The first surrounding region 11sr is provided around the first core part 41. For example, the first surrounding region 11sr is provided around the first core part 41 as an axis of the first direction Dr1. The first surrounding region 11sr does not overlap the first core part 41 in the first direction Dr1. The first extended region 11ep is connected to the first surrounding region 11sr and extends in a second direction Dr2 crossing the first direction Dr1.

The second interconnect part 12u includes the second core part 42 and the second interconnect layer 12. The second interconnect layer 12 includes the second surrounding region 12sr and a second extended region 12ep. The second surrounding region 12sr is provided around the second core part 42. For example, the second surrounding region 12sr is provided around the second core part 42 along the first direction Dr1. The second surrounding region 12sr does not overlap the second core part 42 in the first direction Dr1. The second extended region 12ep is connected to the second surrounding region 12sr and extends in a third direction Dr3 crossing the first direction Dr1 and the second direction Dr2.

The second interconnect connection part 22u overlaps a part of the second interconnect part 12u in the first direction Dr1. The second interconnect connection part 22u includes the second extended connection part 22 and a second extended surrounding part 32.

The second extended connection part 22 overlaps a part of the first extended region 11ep in the third direction Dr3 and overlaps the second core part 42 in the first direction Dr1. The second extended connection part 22 is electrically connected to the second core part 42. The second extended surrounding part 32 is provided around the second extended connection part 22. The second extended surrounding part 32 contains a material contained in the first surrounding region 11sr. The second extended surrounding part 32 is provided around the second extended connection part 22. For example, the second extended surrounding part 32 is provided around the second extended connection part 22 as an axis of the first direction Dr1. The second extended surrounding part 32 does not overlap the second extended connection part 22 in the first direction Dr1.

The first direction Dr1 is, for example, a Z-direction. The second direction Dr2 is a Y-direction. The third direction Dr3 is an X-direction.

The semiconductor memory device 110 according to the embodiment may further include a resistance change layer (first resistance change layer 1R) provided between the second extended region 12ep and the first extended region 11ep and between the second surrounding region 12sr and the second extended surrounding part 32.

The semiconductor memory device 110 according to the embodiment may further include a first conductive part 61, a first conductive connection part 61M, the second conductive part 62 and the second conductive connection part 62M.

The first conductive part 61 is provided to be separate from the first core part 41. The first conductive connection part 61M is provided between the first conductive part 61 and the first core part 41. The second conductive part 62 is provided to be separate from the second extended connection part 22. The second conductive connection part 62M is provided between the second conductive part 62 and the second extended connection part 22.

The semiconductor memory device 110 according to the embodiment may further include a first metal boundary layer 51. The first metal boundary layer 51 is provided between the first surrounding region 11sr and the first core part 41 and between the first core part 41 and the first conductive connection part 61M.

The semiconductor memory device 110 according to the embodiment may further include a first layer second metal boundary layer 52a and a second layer second metal boundary layer 52b. A second metal boundary layer 52 includes the first layer second metal boundary layer 52a and the second layer second metal boundary layer 52b. The first layer second metal boundary layer 52a is provided between the second extended surrounding part 32 and the second extended connection part 22 and between the second extended connection part 22 and the second conductive connection part 62M. The second layer second metal boundary layer 52b is provided between the second surrounding region 12sr and the second core part 42 and between the second core part 42 and the second extended connection part 22.

The first interconnect layer 11 is, for example, a first word line WL1. The second interconnect layer 12 is, for example, a first bit line BL1. The first resistance change layer 1R is provided between the first extended region 11ep of the first interconnect layer 11 (the first word line WL1) and the second extended region 12ep of the second interconnect layer (the first bit line BL1).

When, for example, a voltage VT is applied between the first word line WL1 and the first bit line BL1, the resistance of the first resistance change layer 1R becomes low. Hereby, a current flows through the first resistance change layer 1R. When, for example, a voltage VR lower than the voltage VT is applied between the first word line WL1 and the first bit line BL1, the resistance of the first resistance change layer 1R becomes high. Hereby, a current becomes hard to flow through the first resistance change layer 1R. The resistance of the first resistance change layer 1R is changed according to the applied voltage.

In the semiconductor memory device 110 according to the embodiment, the first surrounding region 11sr of the first interconnect layer 11 is provided around the first core part 41. The first core part 41 contacts the side wall interconnect part (first surrounding region 11sr). Thus, the contact resistance (contacting resistance) between the first core part 41 and the first surrounding region 11sr can be reduced.

In the semiconductor memory device 110 according to the embodiment, the second surrounding region 12sr of the second interconnect layer 12 is provided around the second core part 42. The second core part 42 contacts the side wall interconnect part (second surrounding region 12sr). Thus, the contact resistance between the second core part 42 and the second surrounding region 12sr can be reduced.

As a result, the semiconductor memory device can be provided in which the operation stability can be improved.

Figures 4A, 4B:
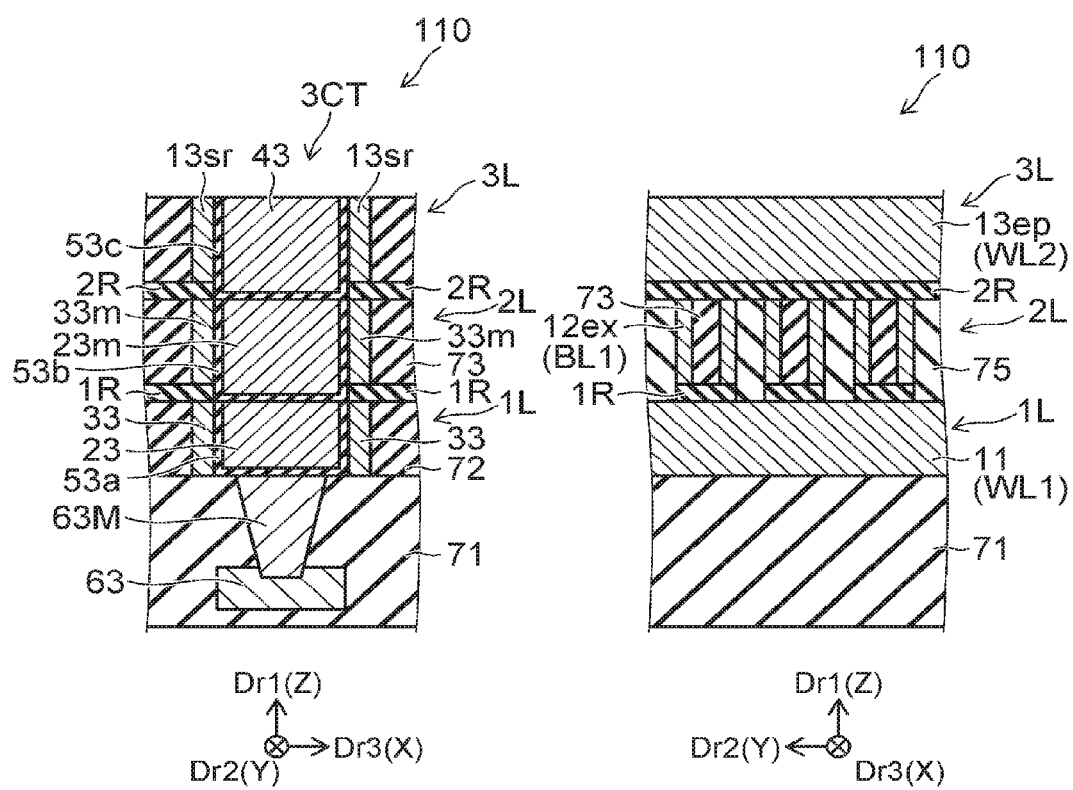
FIG. 4A and FIG. 4B are schematic views illustrating part of the semiconductor memory device according to the embodiment.

FIG. 4A and FIG. 4B are schematic views illustrating part of the semiconductor memory device according to the embodiment.

FIG. 4A is a schematic sectional view along line H1-H2 of FIG. 2, and FIG. 4B is a schematic sectional view along line G1-G2 of FIG. 2.

As shown in FIG. 4A and FIG. 4B, the semiconductor memory device 110 according to the embodiment may further includes a third core part 43, a third interconnect layer 13, a third extended connection part 23, a third extended surrounding part 33, a third extended intermediate connection part 23m, and a third extended intermediate surrounding part 33m.

The third core part 43 is provided to be separate from the first core part 41 and to be separate from the second core part 42. The third interconnect layer 13 includes a third surrounding region 13sr and a third extended region 13ep. The third surrounding region 13sr is provided around the third core part 43. For example, the third surrounding region 13sr is provided around the third core part 43 as an axis of the first direction Dr1. The third surrounding region 13sr does not overlap the third core part 43 in the first direction Dr1. The third extended region 13ep is provided to be separate from the second extended region 12ep in the first direction Dr1. The third extended region 13ep is connected to the third surrounding region 13sr and extends in the second direction Dr2.

The third extended connection part 23 overlaps the third core part 43 in the first direction Dr1. The third extended surrounding part 33 is provided around the third extended connection part 23. For example, the third extended surrounding part 33 is provided around the third extended connection part 23 as an axis of the first direction Dr1. The third extended surrounding part 33 does not overlap the third extended connection part 23 in the first direction Dr1. The third extended surrounding part 33 contains a material contained in the first surrounding region 11sr.

The third extended intermediate connection part 23m is provided between the third core part 43 and the third extended connection part 23. The third extended intermediate connection part 23m is electrically connected to the third core part 43. The third extended intermediate connection part 23m is electrically connected to the third extended connection part 23.

The third extended intermediate surrounding part 33m is provided around the third extended intermediate connection part 23m. For example, the third extended intermediate surrounding part 33m is provided around the third extended intermediate connection part 23m as an axis of the first direction Dr1. The third extended intermediate surrounding part 33m does not overlap the third extended intermediate connection part 23m in the first direction Dr1. The third extended intermediate surrounding part 33m contains a material contained in the second surrounding region 12sr.

The semiconductor memory device 110 according to the embodiment may further include a second resistance change layer 2R provided between the third surrounding region 13sr and the third extended intermediate surrounding part 33m and between the third interconnect layer 13 and the second interconnect layer 12.

The semiconductor memory device 110 according to the embodiment may further include a third conductive part 63 provided to be separate from the third core part 43 and a third conductive connection part 63M provided between the third conductive part 63 and the third core part 43.

The semiconductor memory device 110 according to the embodiment may further include a first layer third metal boundary layer 53a, a second layer third metal boundary layer 53b and a third layer third metal boundary layer 53c. A third metal boundary layer 53 includes the first layer third metal boundary part 53a, the second layer third metal boundary layer 53b and the third layer third metal boundary layer 53c.

The first layer third metal boundary layer 53a is disposed between the third extended surrounding part 33 and the third extended connection part 23 and between the third extended connection part 23 and the third conductive connection part 63M. The second layer third metal boundary layer 53b is disposed between the third extended intermediate surrounding part 33m and the third extended intermediate connection part 23m and between the third extended intermediate connection part 23m and the third extended connection part 23. The third layer third metal boundary layer 53c is disposed between the third surrounding region 13sr and the third core part 43 and between the third core part 43 and the third extended intermediate connection part 23m.

Examples of materials are given below.

A core member (insulating layer 72, insulating layer 73) contains, for example, silicon oxide. One of the first to the third interconnect layers 11 to 13, the second extended surrounding part 32, the third extended intermediate surrounding part 33m and the third extended surrounding part 33 contains, for example, tungsten.

One of the first resistance change layer 1R and the second resistance change layer 2R contains a metal oxide. The metal oxide is, for example, aluminum oxide, nickel oxide, hafnium oxide, tantalum oxide, titanium oxide or the like. One of the first resistance change layer 1R and the second resistance change layer 2R includes a single layer or plural layers of the metal oxide.

One of the first metal boundary layer 51, the second metal boundary layer 52 and the third metal boundary layer 53 contains, for example, one of titanium nitride and tungsten nitride.

One of the first to the third core parts 41 to 43, the second extended connection part 22, the third extended intermediate connection part 23m and the third extended connection part 23 contains, for example, one of copper, silver and tungsten.

Figure 5A:
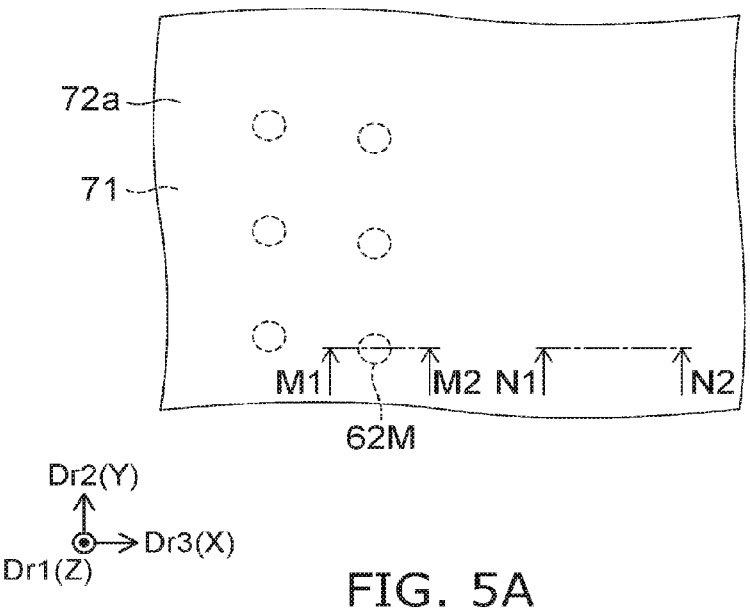
FIG. 5A to FIG. 5C are schematic views illustrating a method for manufacturing the semiconductor memory device according to the embodiment.
Figures 5B, 5C:
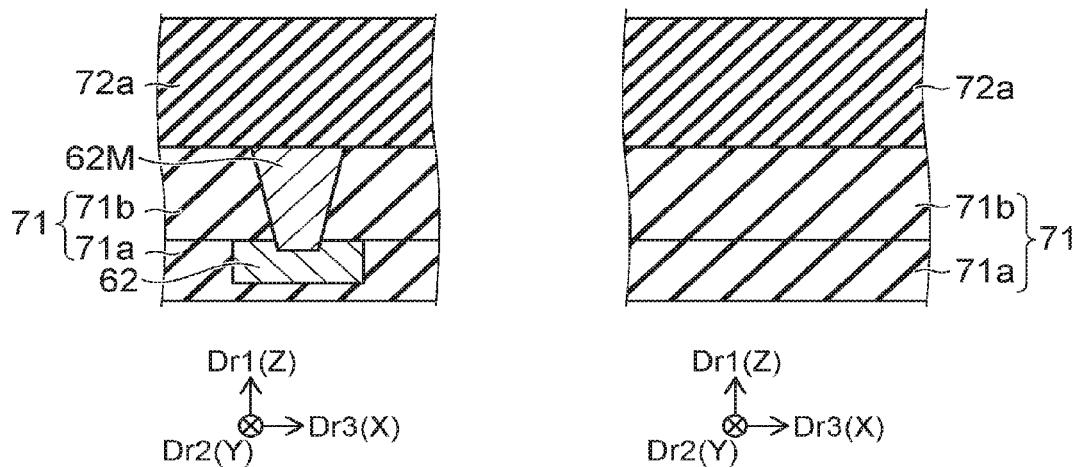

FIG. 5A to FIG. 5C are schematic views illustrating a method for manufacturing the semiconductor memory device according to the embodiment.

FIG. 5A is a schematic plan view. FIG. 5B is a schematic sectional view along line M1-M2 of FIG. 5A. FIG. 5C is a schematic sectional view along line N1-N2 of FIG. 5A.

As shown in FIG. 5A to FIG. 5C, an insulating layer 71a is formed by depositing, for example, an insulating material containing silicon oxide. A part of the insulating layer 71a is removed. A second conductive part 62 is formed by depositing a conductive member in a space where the part of the insulating layer 71a is removed. An insulating layer 71b is formed by depositing an insulating material on the second conductive part 62 and the insulating layer 71a. A part of the insulating layer 71b and a part of the second conductive part 62 are removed. A second conductive connection part 62M is formed by depositing a conductive material in a space where the part of the insulating layer 71b and the part of the second conductive part 62 are removed. An insulating layer 71 includes the insulating layer 71a and the insulating layer 71b.

An insulating layer 72a is formed by depositing, for example, an insulating material containing silicon oxide on the insulating layer 71 and the second conductive connection part 62M.

The method for manufacturing the semiconductor memory device according to the embodiment is illustrated in schematic views below.

Figure 6A:
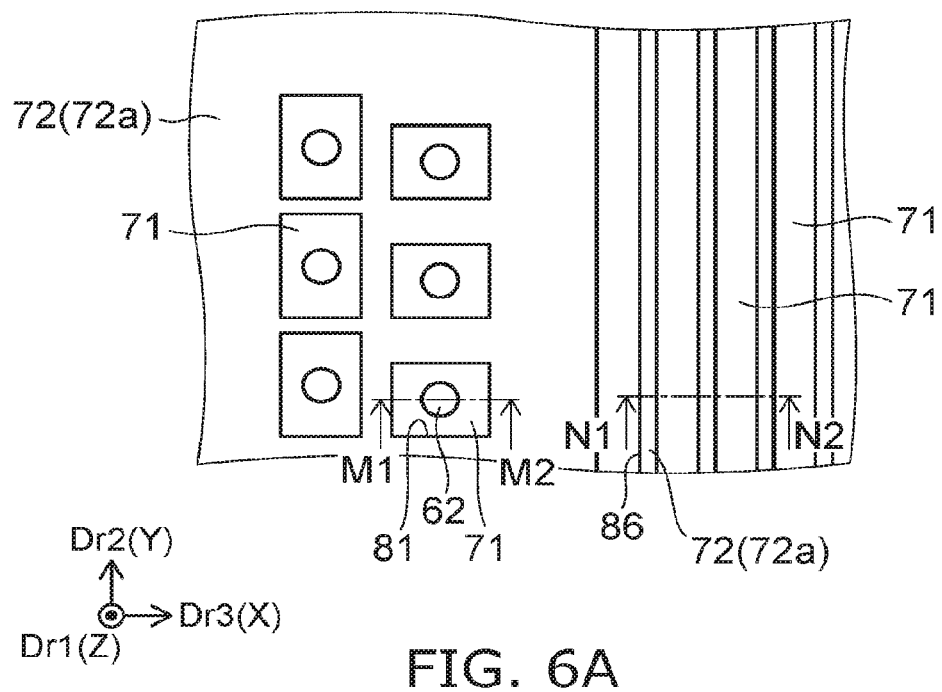
Figure 6B:
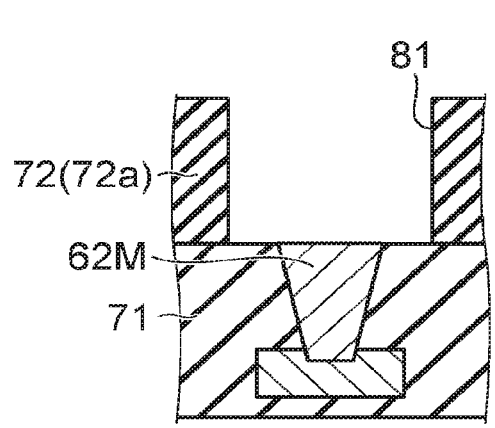
Figure 6C:
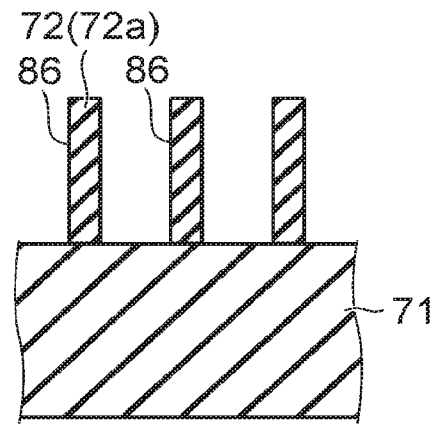

FIG. 6A is a plan view. FIG. 6B is a sectional view along line M1-M2 of FIG. 6A. FIG. 6C is a sectional view along line N1-N2 of FIG. 6A.

FIG. 7A is a plan view. FIG. 7B is a sectional view along line M1-M2 of FIG. 7A. FIG. 7C is a sectional view along line N1-N2 of FIG. 7A.

FIG. 8A is a plan view. FIG. 8B is a sectional view along line M1-M2 of FIG. 8A. FIG. 8C is a sectional view along line N1-N2 of FIG. 8A.

Figure 9A:
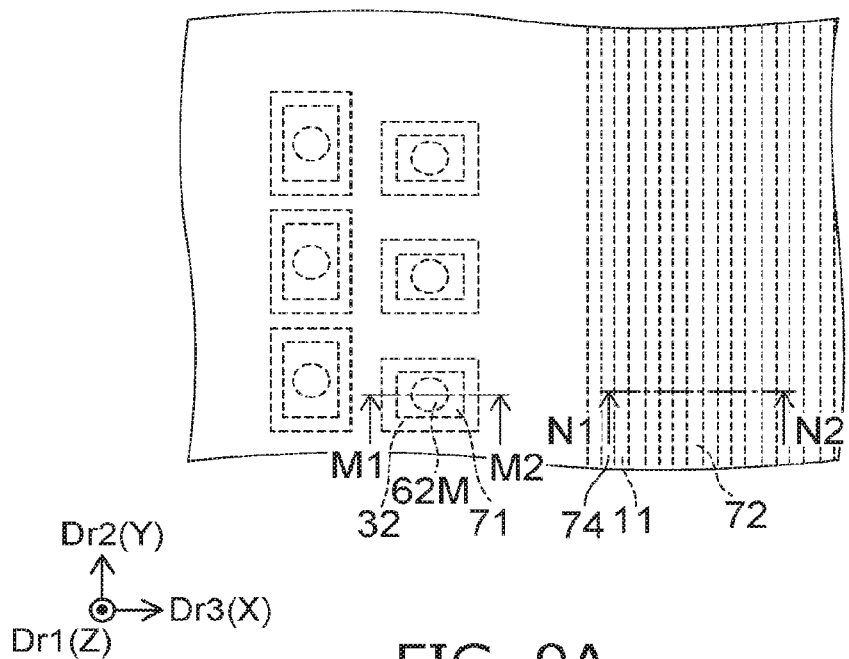
Figures 9B, 9C:
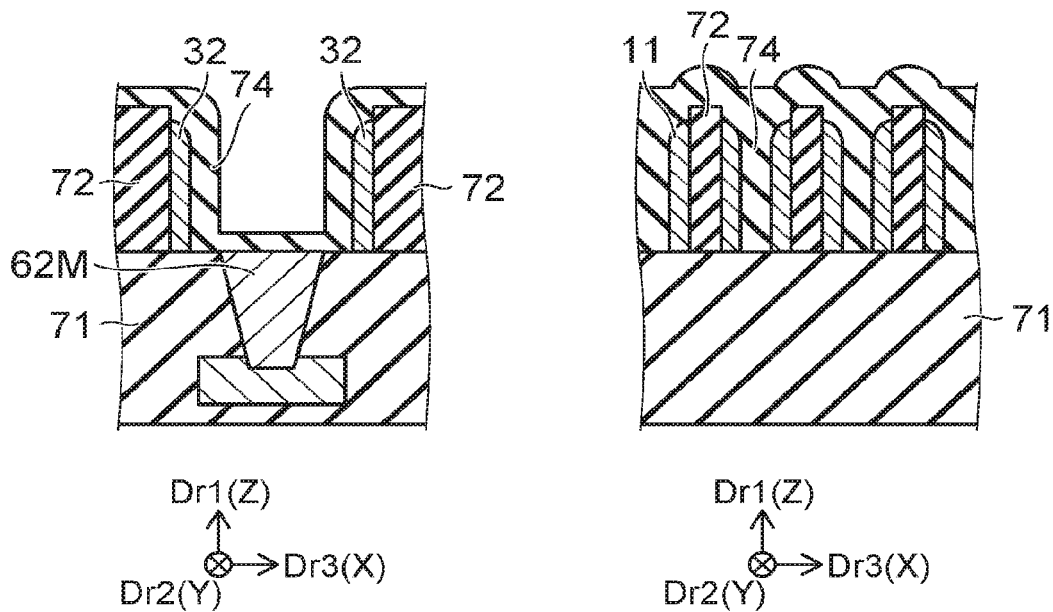

FIG. 9A is a plan view. FIG. 9B is a sectional view along line M1-M2 of FIG. 9A. FIG. 9C is a sectional view along line N1-N2 of FIG. 9A.

FIG. 10A is a plan view. FIG. 10B is a sectional view along line M1-M2 of FIG. 10A. FIG. 10C is a sectional view along line N1-N2 of FIG. 10A.

Figure 11A:
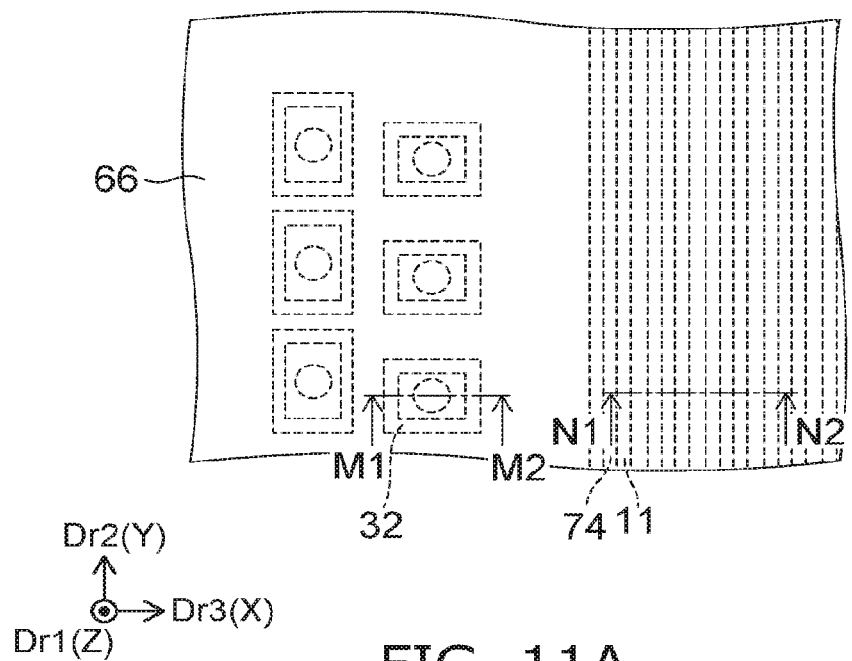
Figure 11B:
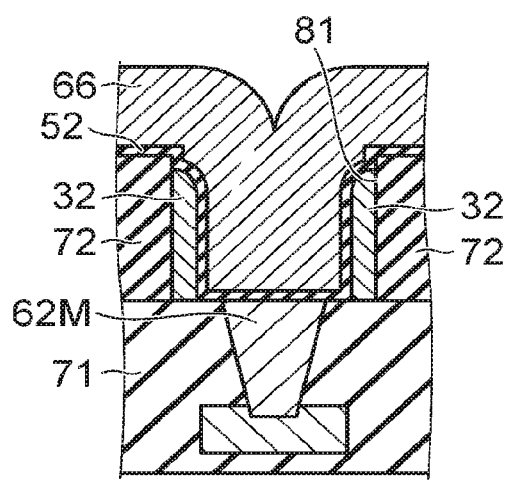
Figure 11C:
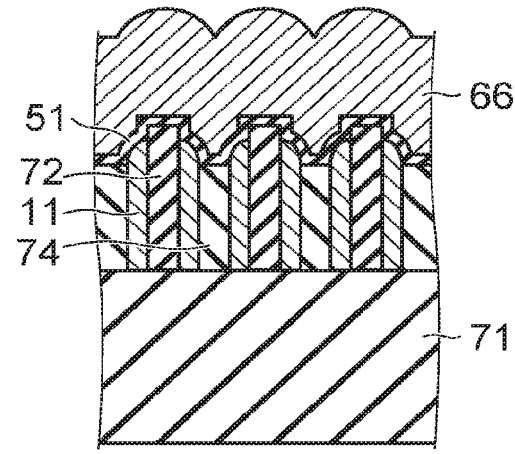

FIG. 11A is a plan view. FIG. 11B is a sectional view along line M1-M2 of FIG. 11A. FIG. 11C is a sectional view along line N1-N2 of FIG. 11A.

Figure 12A:
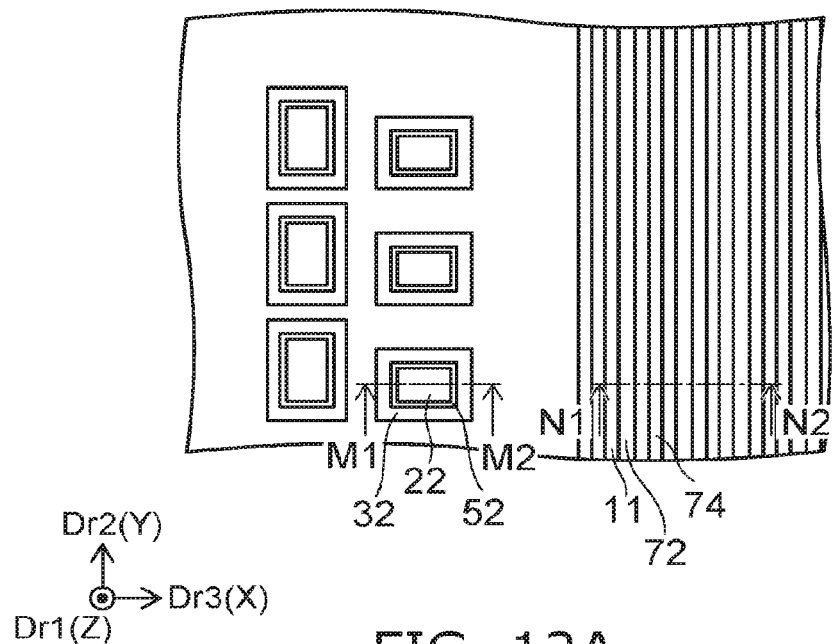
Figure 12B:
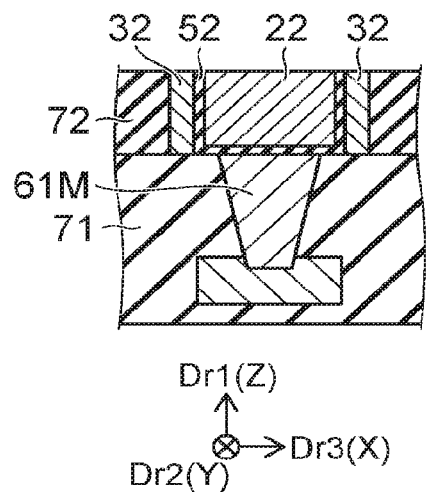
Figure 12C:
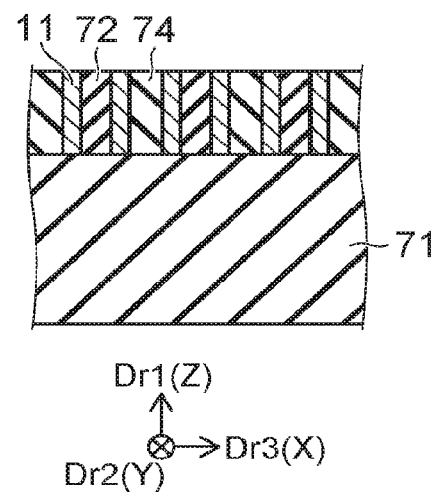

FIG. 12A is a plan view. FIG. 12B is a sectional view along line M1-M2 of FIG. 12A. FIG. 12C is a sectional view along line N1-N2 of FIG. 12A.

Figure 13A:
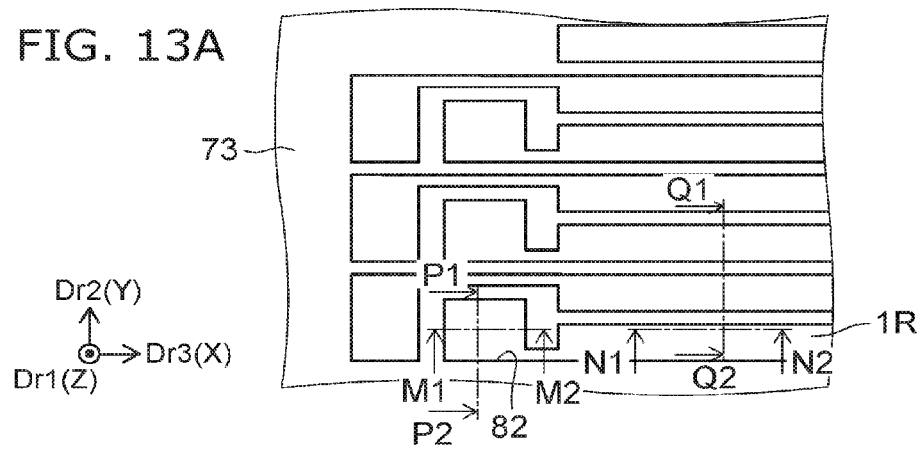
Figure 13B:
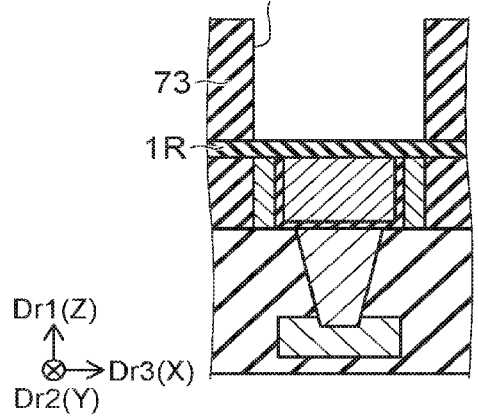
Figure 13C:
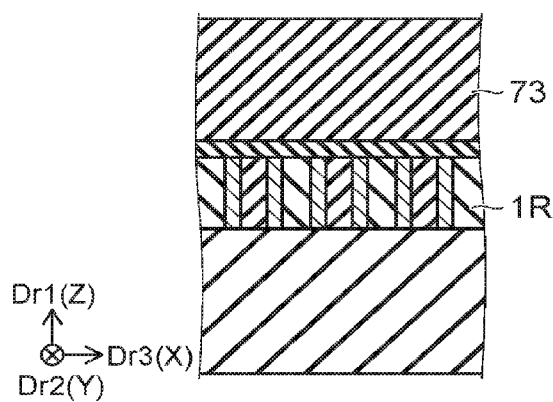
Figure 13D:
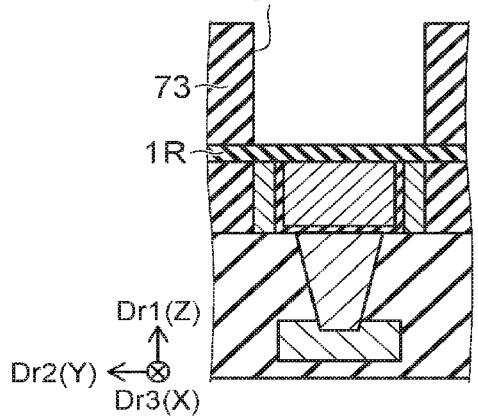
Figure 13E:
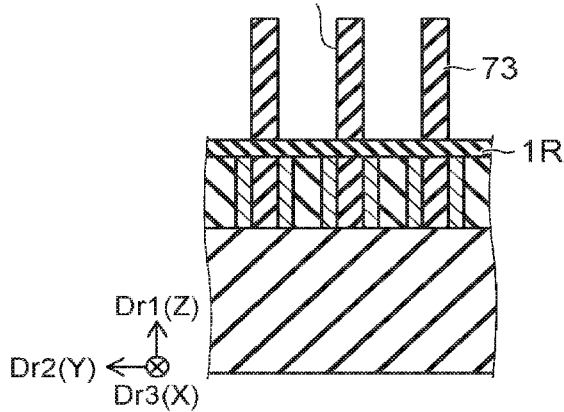

FIG. 13A is a plan view. FIG. 13B is a sectional view along line M1-M2 of FIG. 13A. FIG. 13C is a sectional view along line N1-N2 of FIG. 13A. FIG. 13D is a sectional view along line P1-P2 of FIG. 13A. FIG. 13E is a sectional view along line Q1-Q2 of FIG. 13A.

Figure 14A:
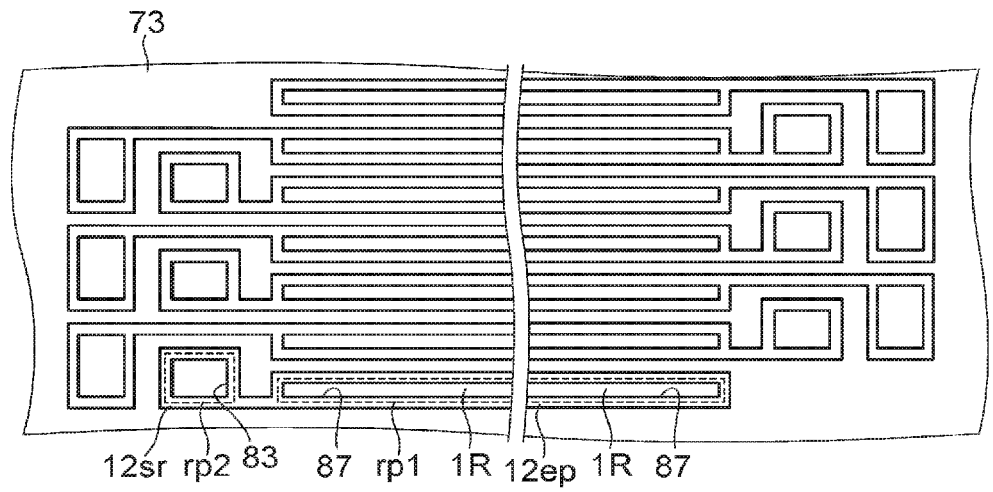
Figure 14B:
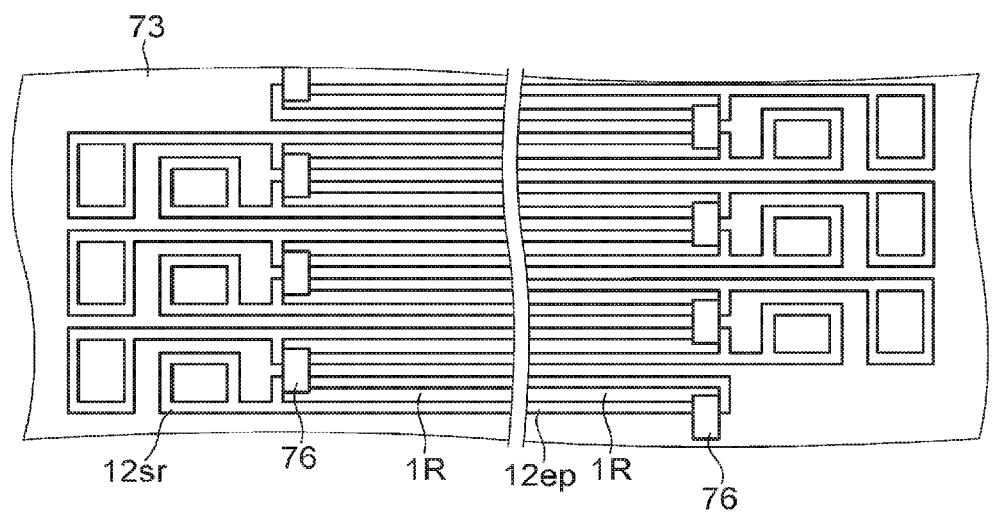

FIG. 14A and FIG. 14B are plan views.

FIG. 15A is a plan view. FIG. 15B is a sectional view along line P1-P2 of FIG. 15A. FIG. 15C is a sectional view along line Q1-Q2 of FIG. 15A.

Figure 16A:
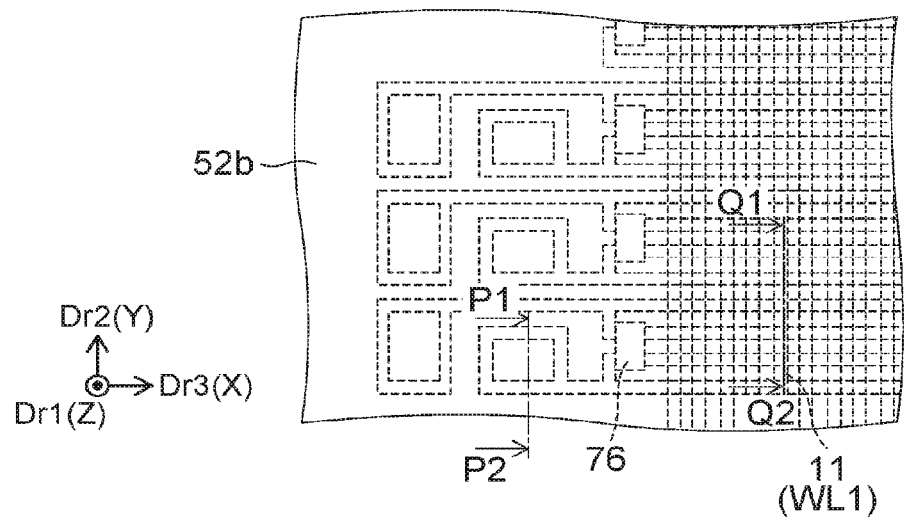
Figures 16B, 16C:
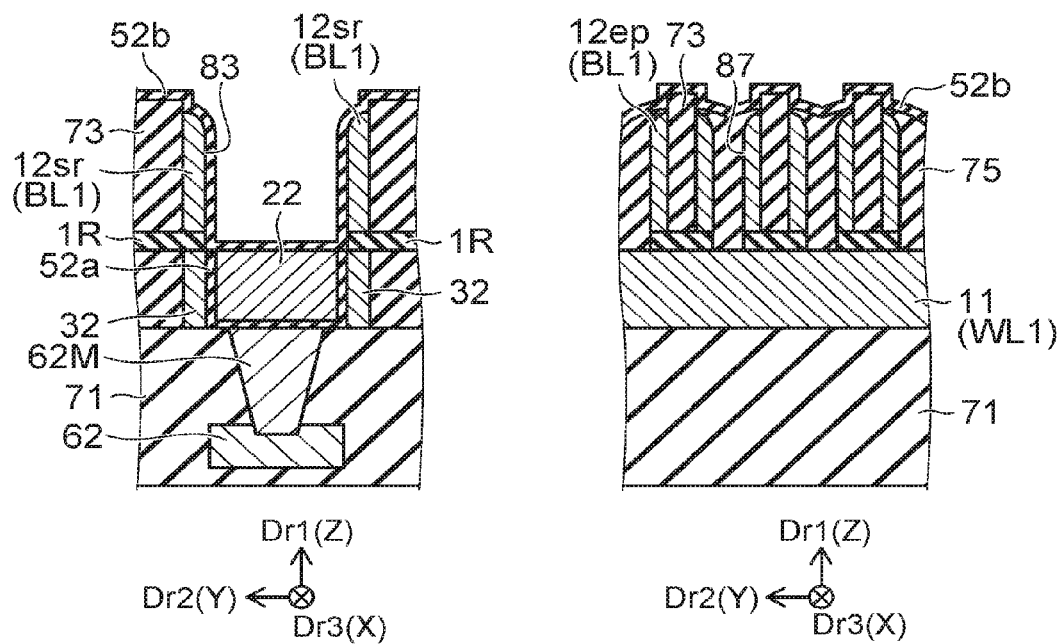

FIG. 16A is a plan view. FIG. 16B is a sectional view along line P1-P2 of FIG. 16A. FIG. 16C is a sectional view along line Q1-Q2 of FIG. 16A.

Figure 17A:
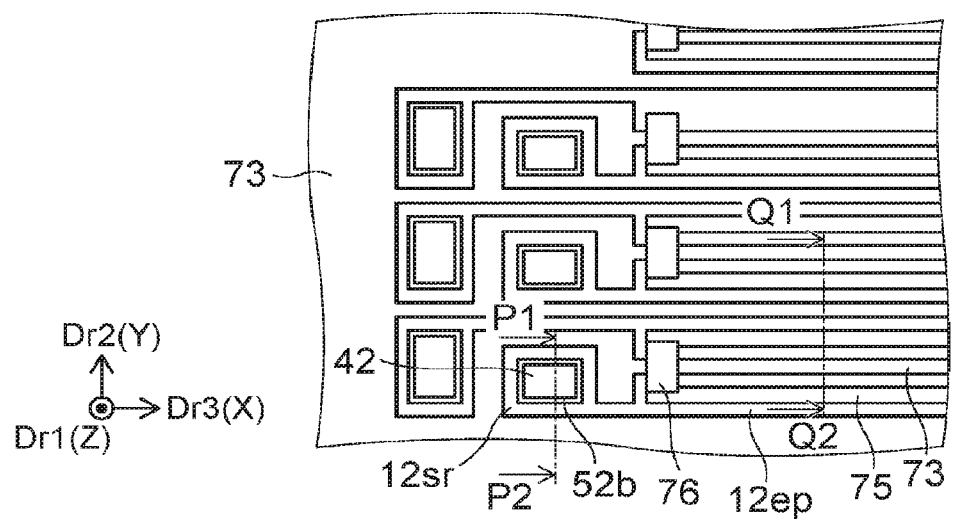
Figures 17B, 17C:
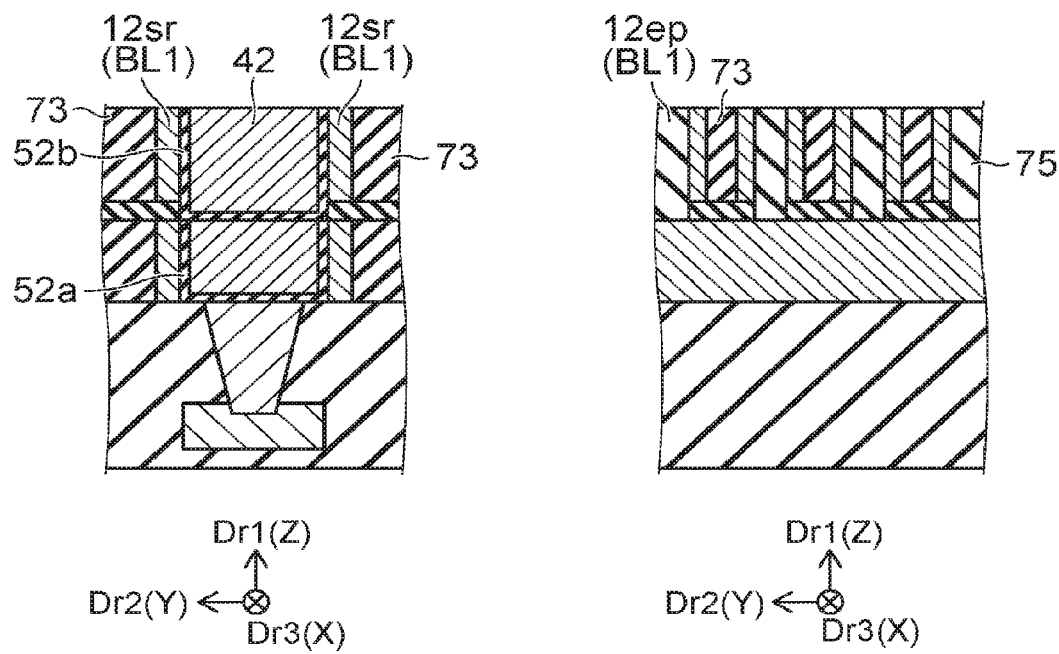

FIG. 17A is a plan view. FIG. 17B is a sectional view along line P1-P2 of FIG. 17A. FIG. 17C is a sectional view along line Q1-Q2 of FIG. 17A.

Figure 18A:
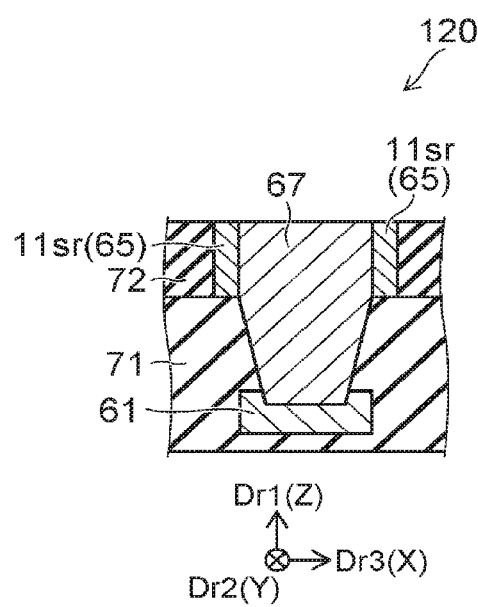
Figure 18B:
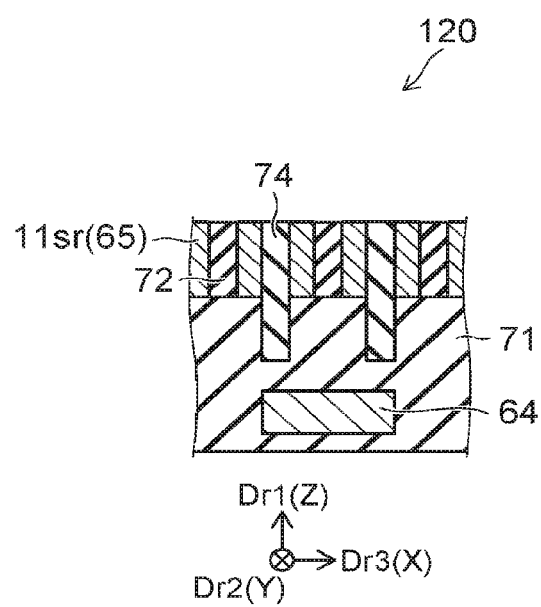

FIG. 18A corresponds to a sectional view along line B1-B2 of FIG. 2. FIG. 18B corresponds to a sectional view along line C1-C2 of FIG. 2.

Figure 19A:
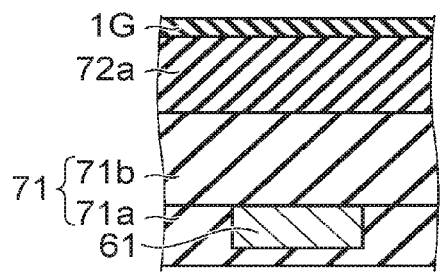
Figure 19B:
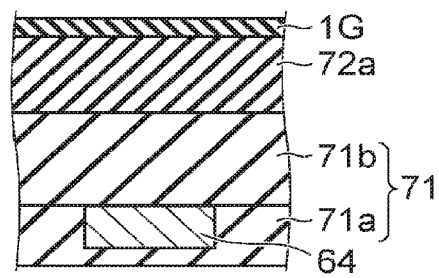
Figure 19C:
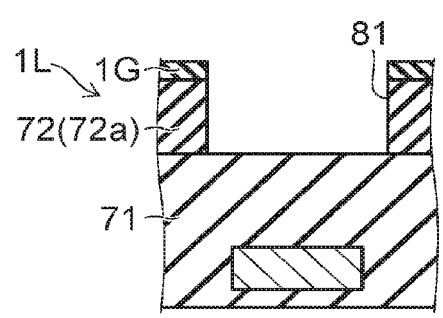
Figure 19D:
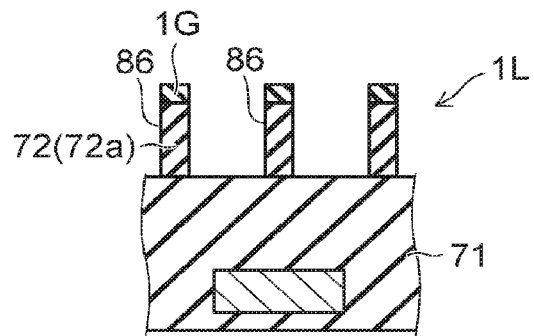
Figure 19E:
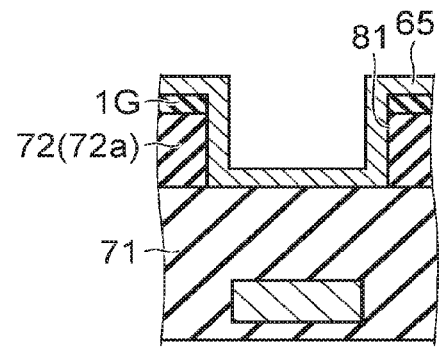
Figure 19F:
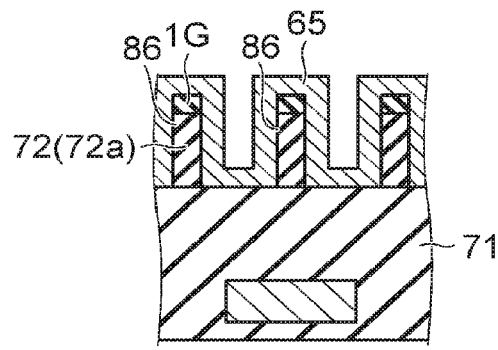

FIG. 19A, FIG. 19C and FIG. 19E correspond to sectional views along line B1-B2 of FIG. 2. FIG. 19B, FIG. 19D and FIG. 19F correspond to sectional views along line C1-C2 of FIG. 2.

Figure 20A:
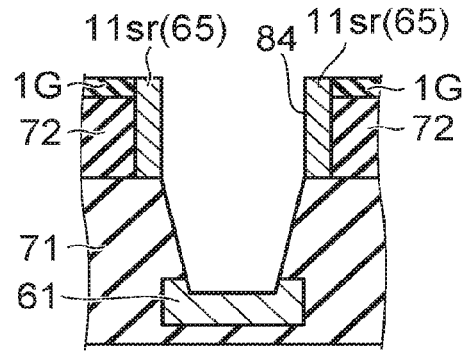
Figure 20B:
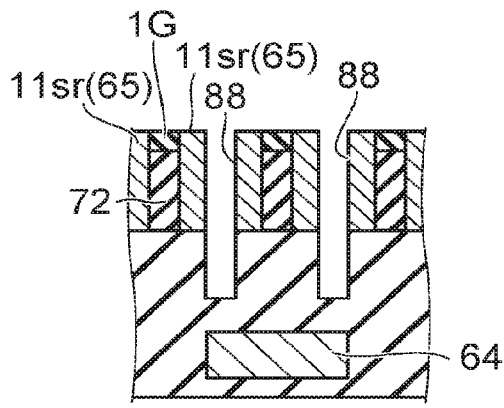
Figure 20C:
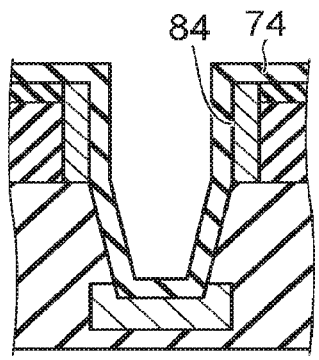
Figure 20D:
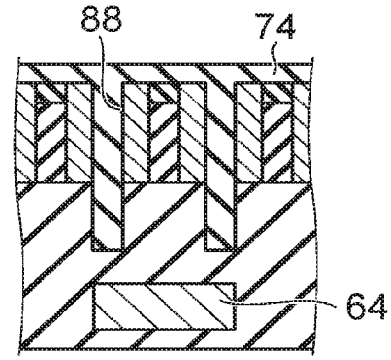
Figure 20E:
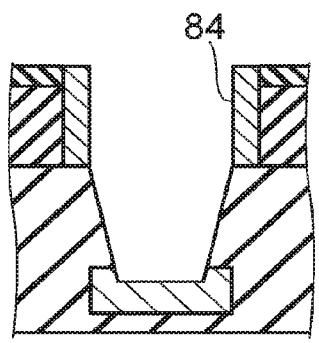
Figure 20F:
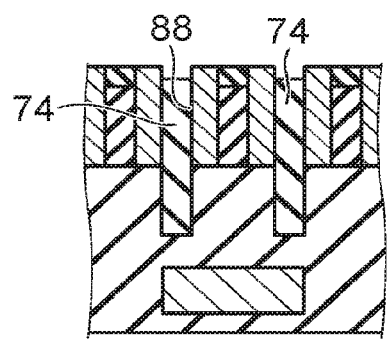

FIG. 20A, FIG. 20C and FIG. 20E correspond to sectional views along line B1-B2 of FIG. 2. FIG. 20B, FIG. 20D and FIG. 20F correspond to sectional views along line C1-C2 of FIG. 2.

Figure 21A:
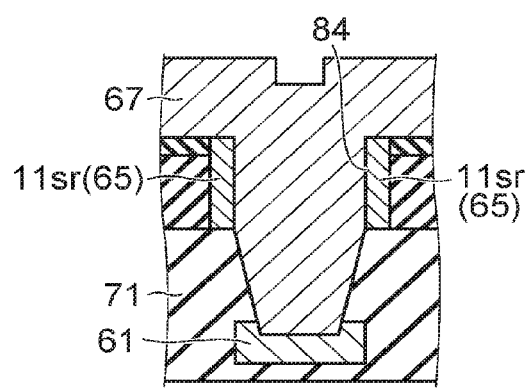
Figure 21B:
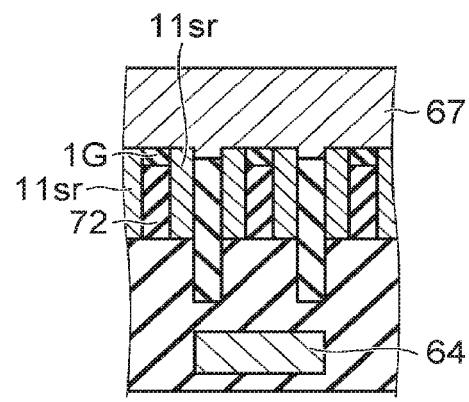
Figure 21C:
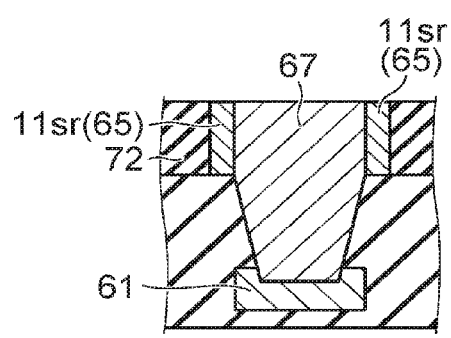
Figure 21D:
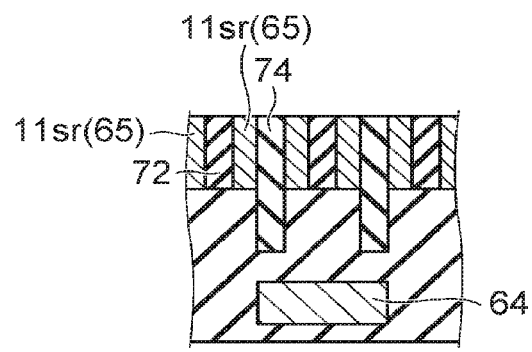

FIG. 21A and FIG. 21C correspond to sectional views along line B1-B2 of FIG. 2. FIG. 21B and FIG. 21D correspond to sectional views along line C1-C2 of FIG. 2.

Figure 22A:
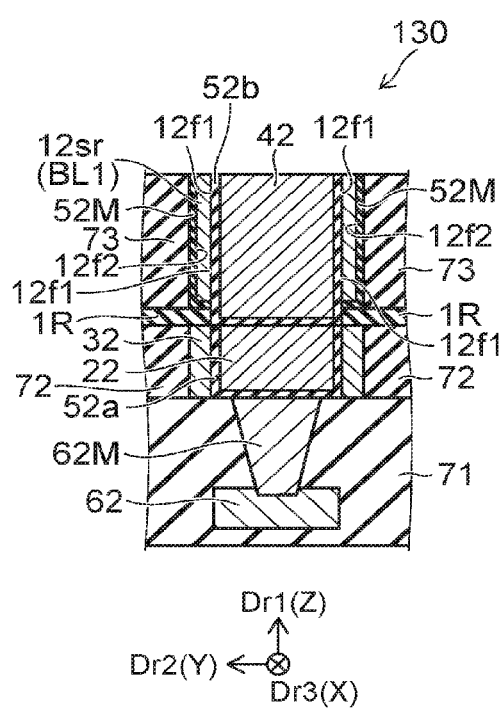
Figure 22B:
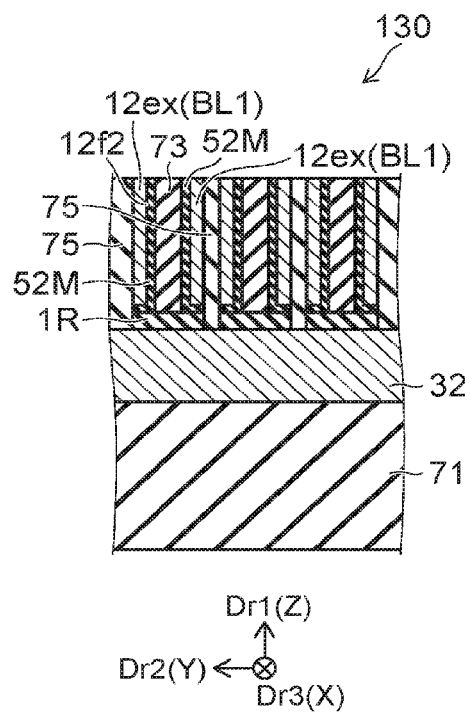

FIG. 22A corresponds to a sectional view along line F1-F2 of FIG. 2. FIG. 22B corresponds to a sectional view along line G1-G2 of FIG. 2.

As shown in FIG. 6A to FIG. 6C, an opening 81 is formed by removing a part of the insulating layer 72a. A groove 86 is formed by removing another part of the insulating layer 72. The groove 86 extends in the second direction Dr2. A remaining part of the insulating layer 72a is the core member (insulating layer 72) of the first layer 1L.

As shown in FIG. 7A to FIG. 7C, a conductive member 65 is formed by, for example, depositing tungsten on the second conductive connection part 62M, the insulating layer 71 and the insulating layer 72 by a CVD (Chemical Vapor Deposition) method.

As shown in FIG. 8A to FIG. 8C, the conductive member 65 is subjected to, for example, anisotropic RIE (Reactive Ion Etching). Hereby, a part of the conductive member 65 is removed and the conductive member 65 on the side wall portion (insulating layer 72) remains, so that a second extended surrounding part 32 and a first interconnect layer 11 are formed.

As shown in FIG. 9A to FIG. 9C, an insulating layer 74 is formed by depositing, for example, silicon oxide on the first interconnect layer 11, the second extended surrounding part 32, the second conductive connection part 62M, the insulating layer 71 and the insulating layer 72 by, for example, an ALD (Atomic Layer Deposition) method or a CVD method. At this time, since the opening 81 is sufficiently wide, the opening is not buried with the insulating layer 74. Since a space between the interconnects of the first interconnect layer 11 is sufficiently narrow, the space is buried with the insulating layer 74.

As shown in FIG. 10A to FIG. 10C, a part of the insulating layer 74 is removed by wet etching using DHF (Diluted HydroFluoric acid) or the like. At this time, since the opening 81 is sufficiently wide, the wet etching proceeds isotropically and the entire grown insulating layer 74 can be removed. On the other hand, only a part of the insulating layer 74 exposed on the surface is etched in the insulating layer 74 formed in the space of the first interconnect layer 11, and the insulating layer 74 buried in the space remains.

A barrier metal layer (first layer second metal boundary layer 52a) is formed on the insulating layer 72, the second extended surrounding part 32, the insulating layer 71, the second conductive connection part 62M, the first interconnect layer 11 and the insulating layer 74. The first layer second metal boundary layer 52a contains, for example, at least one of titanium, titanium nitride and tungsten nitride. For example, the first layer second metal boundary layer 52a includes a single layer of one of titanium, titanium nitride and tungsten nitride. For example, the first layer second metal boundary layer 52a may include a stacked bodies including two or more of a layer containing titanium, a layer containing titanium nitride, and a layer containing tungsten nitride.

As shown in FIG. 11A to FIG. 11C, a buried part (conductive member 66) is formed by depositing a conductive material on the first layer second metal boundary layer 52a by, for example, a CVD method or a PVD (Physical Vapor Deposition) method. At this time, the opening 81 is also buried with the conductive material. The conductive material includes, for example, one of copper, silver and tungsten.

As shown in FIG. 12A to FIG. 12C, the conductive member 66 is subjected to, for example, CMP (Chemical Mechanical Polishing) and is flattened. Hereby, a second extended connection part 22 is formed. In this way, the side wall part (second extended surrounding part 32) and the contact part (second extended connection part 22) are formed.

As shown in FIG. 13A to FIG. 13E, a first resistance change layer 1R is formed on the insulating layer 71, the insulating layer 72, the insulating layer 74, the second extended surrounding part 32, the second conductive connection part 62M and the first interconnect layer 11. A core member (insulating layer 73) of a second layer 2L is formed on the first resistance change layer 1R by depositing, for example, an insulating material containing silicon oxide. After a mask (not shown) is formed on a part of the insulating layer 73, for example, RIE is performed. Hereby, a part of the insulating layer 73 is removed and an opening 82 is formed.

As shown in FIG. 14A, a second interconnect layer 12 is formed in the second layer 2L similarly to the formation of the first interconnect layer 11 of the first layer 1L. For example, tungsten is deposited on the first resistance change layer 1R and the insulating layer 73 by the CVD method. The second interconnect layer 12 is formed by RIE. The second interconnect layer 12 is formed on the side wall of the insulating layer 73. Hereby, a part of the opening 82 is buried with the second interconnect layer 12. The opening 82 is separated into an opening 83 and an opening 87.

The second interconnect layer 12 includes a second extended region 12ep formed in the opening 87 and a second surrounding region 12sr formed in the opening 83. The second extended region 12ep forms a first loop rp1. The second surrounding region 12sr forms a second loop rp2.

As shown in FIG. 14B, a part of the second extended region 12ep is removed. A loop cut part (insulating layer 76) is formed by depositing an insulating material after the part of the second extended region 12ep is removed. Hereby, the first loop rp1 of the second extended region 12ep is separated.

The second surrounding region 12sr and another second surrounding region are formed on both sides of the second extended region 12ep. Thus, the loop cut part (insulating layer 76) is also formed on both sides of the second extended region 12ep.

As shown in FIG. 15A to FIG. 15C, the first resistance change layer 1R in the opening 83 and the first resistance change layer 1R in the opening 87 are removed by RIE. Hereby, the second extended connection part 22 is exposed in the opening 83. A part of the first interconnect layer 11 is exposed in the opening 87.

Next, similarly to the first interconnect layer 11, the insulating layer 73 is used as a core member, and a conductive layer of tungsten or the like is formed by a CVD method. Next, the second interconnect layer 12 is formed by anisotropic etching such as RIE.

As shown in FIG. 16A to FIG. 16C, an insulating layer 75 is formed by depositing, for example, silicon oxide on the insulating layer 73 and the second interconnect layer 12 by an ALD method. A part of the insulating layer 75 is removed by etching. At this time, the entire insulating layer 75 is etched in the opening 83. A part of the insulating layer 75 buried in the space of the second interconnect layer is not etched but remains. A barrier metal layer (second layer second metal boundary layer 52b) is formed on the insulating layer 73, the second interconnect layer, the second extended connection part 22 and the insulating layer 75.

As shown in FIG. 17A to FIG. 17C, a second core part 42 is formed in the second extended connection part 22 similarly to the formation of the second extended connection part 22. In this way, the side wall interconnect part (second surrounding region 12sr) of the second layer 2L and the contact part (second core part 42) are formed.

Layers above the second layer 2L are formed by repeating the formation of the first layer 1L and the second layer 2L.

In the method for manufacturing the semiconductor memory device 110 according to the embodiment, the side wall process (see FIG. 6 to FIG. 8, FIG. 13 to FIG. 15) is performed. In the side wall process, the conductive material is formed on the side wall of the core member, and the interconnect layer is formed by anisotropic etching. While the minute interconnect (first interconnect layer 11, second interconnect layer 12) are formed, the contacts (first contact part 1CT, second contact part 2CT) connected to the lower interconnects (conductive part 61, conductive part 62) can be formed by the side wall process.

As shown in FIG. 18A and FIG. 18B, as compared to the semiconductor memory device 110, a semiconductor memory device 120 includes a conductive part 64 provided in the insulating layer 71. The length of an insulating layer 74 of the semiconductor memory device 120 in the first direction Dr1 is longer than the length of the insulating layer 74 of the semiconductor memory device 110 in the first direction Dr1.

As shown in FIG. 19A and FIG. 19B, an insulating layer 71a is formed by depositing an insulating material containing, for example, silicon oxide. A part of the insulating layer 71a is removed. A first conductive part 61 is formed by depositing a conductive member in a space where the part of the insulating layer 71a is removed. Another part of the insulating layer 71a is removed. A conductive part 64 is formed by depositing a conductive member in a space where the another part of the insulating layer 71a is removed.

An insulating layer 71b is formed by depositing an insulating material on the first conductive part 61, the conductive part 64 and the insulating layer 71a. An insulating layer 71 includes the insulating layer 71a and the insulating layer 71b. An insulating layer 72a is formed by depositing an insulating member on the insulating layer 71. A first protecting layer 1G is formed on the insulating layer 72a. The first protecting layer 1G contains, for example, one of amorphous silicon and metal.

As shown in FIG. 19C and FIG. 19D, an opening 81 is formed by removing a part of the insulating layer 72a. A groove 86 is formed by removing another part of the insulating layer 72a. The groove 86 extends in the second direction Dr2. A remaining part of the insulating layer 72a is a core member (insulating layer 72) of the first layer 1L.

As shown in FIG. 19E and FIG. 19F, a conductive member 65 is formed by depositing a conductive material on the insulating layer 71, the insulating layer 72 and the first protecting layer 1G. At this time, the opening 81 and the groove 86 are not buried with the conductive member 65.

As shown in FIG. 20A and FIG. 20B, a part of the conductive member 65 and a part of the insulating layer 71 are removed by etching. The part of the conductive member 65 and the part of the insulating layer 71 are removed so that an opening 84 is formed. The opening 84 reaches the first conductive part 61. Another part of the conductive member 65 and another part of the insulating layer 71 are removed so that a groove 88 is formed. The groove 88 does not reach the lower interconnect (conductive part 64) by a loading effect. A part of the first conductive part 61 and the first protecting layer 1G are exposed by etching. Since the core member (insulating layer 72) of the first layer 1L is protected by the first protecting layer 1G, the core member is not removed but remains.

As shown in FIG. 20C and FIG. 20D, an insulating layer 74 is formed by depositing an insulating material on the first protecting layer 1G and the first interconnect layer 11. At this time, the opening 84 is not buried with the insulating layer 74. The groove 88 is buried with the insulating layer 74.

As shown in FIG. 20E and FIG. 20F, a part of the insulating layer 74 is removed by, for example, wet DHF. At this time, since the length of the opening 84 in the third direction Dr3 and the length in the second direction Dr2 are large, the entire insulating layer 74 in the opening 84 is removed. Since the length of the groove 88 in the third direction Dr3 is short, a part of the insulating layer 74 in the groove 88 is not removed but remains.

As shown in FIG. 21A and FIG. 21B, a conductive member 67 is formed by depositing a conductive material on the first protecting layer 1G, the first interconnect layer 11, the first conductive part 61 and the insulating layer 74. The opening 84 and the groove 88 are buried with the conductive member 67.

As shown in FIG. 21C and FIG. 21D, the conductive member 67 and the first protecting layer 1G are subjected to CMP and are flattened. Hereby, the insulating layer 72, the first interconnect layer 11 and the insulating layer 74 are exposed. The first protecting layer 1G is removed.

In an element part of the semiconductor memory device according to the embodiment, for example, a CBRAM (Conductive Bridging Random Access Memory) is used.

As shown in FIG. 22A and FIG. 22B, as compared to the semiconductor memory device 110, a semiconductor memory device 130 may be further provided with an ion supply layer (second metal containing layer 52M).

The second metal containing layer 52M is provided between a second extended surrounding part 32 and a second surrounding region 12sr and between a second extended region 12ep and a first interconnect layer 11. A second interconnect layer 12 includes a first surface 12f1 facing a second core part 42 and a second surface 12f2 separate from the first surface 12f1. The second metal containing layer 52M may be further provided on the second surface 12f2.

Incidentally, a counter electrode layer may be provided between a first resistance change layer 1R and the first interconnect layer 11. The first interconnect layer 11 may include the counter electrode layer.

Examples of materials are given below.

The ion supply layer (second metal containing layer 52M) contains, for example, one of copper and silver. The second metal containing layer 52M may contain, for example, an alloy of one of copper and silver and one of titanium and tantalum. The second metal containing layer 52M may contain, for example, an oxide of one of copper and silver. The second metal containing layer 52M may contain, for example, a sulfide of one of copper and silver.

The first resistance change layer 1R contains, for example, one of amorphous silicon, silicon oxide, silicon nitride, hafnium oxide and zirconium oxide. The first resistance change layer 1R includes a single layer structure of, for example, amorphous silicon, silicon oxide, silicon nitride, hafnium oxide and zirconium oxide. The first resistance change layer 1R may include a stacked structure including plural layers selected from layers of amorphous silicon, silicon oxide, silicon nitride, hafnium oxide and zirconium oxide.

The counter electrode layer contains, for example, one of titanium, titanium nitride, tungsten and copper.

FIG. 23A to FIG. 23F and FIG. 24A to FIG. 24F are schematic sectional views of another example of a method for manufacturing the semiconductor memory device according to the embodiment.

Figure 23A:
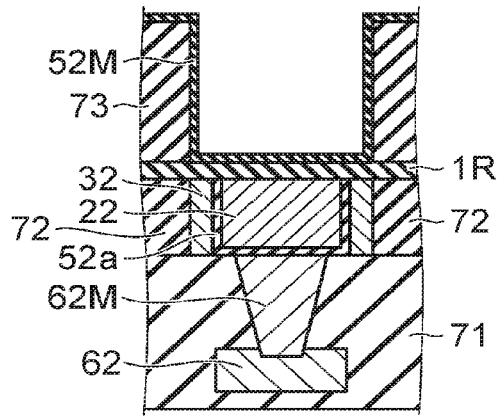
FIG. 23A to FIG. 23F and FIG. 24A to FIG. 24F are schematic views of another example of the method for manufacturing the semiconductor memory device according to the embodiment.
Figure 23B:
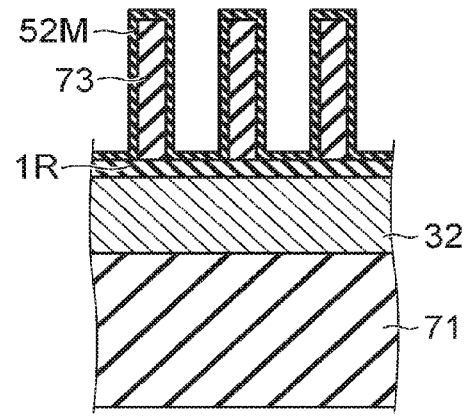
Figure 23C:
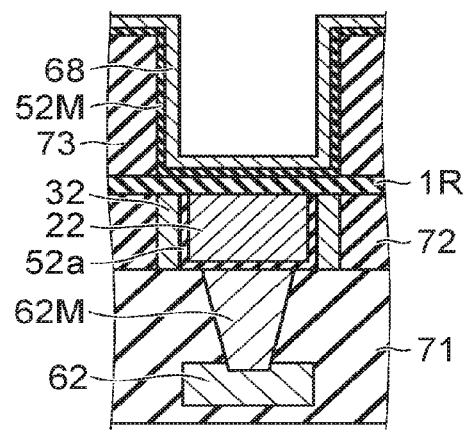
Figure 23D:
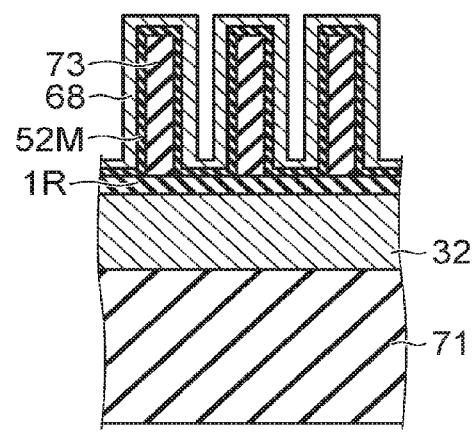
Figure 23E:
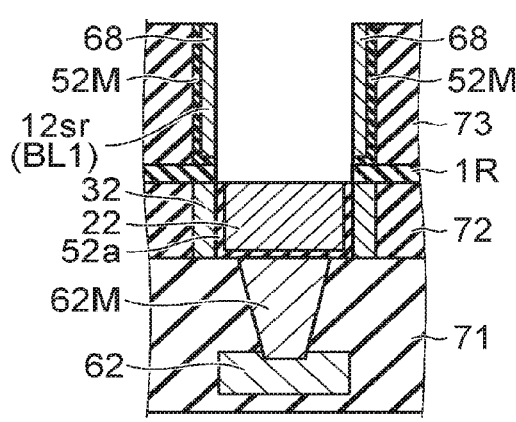
Figure 23F:
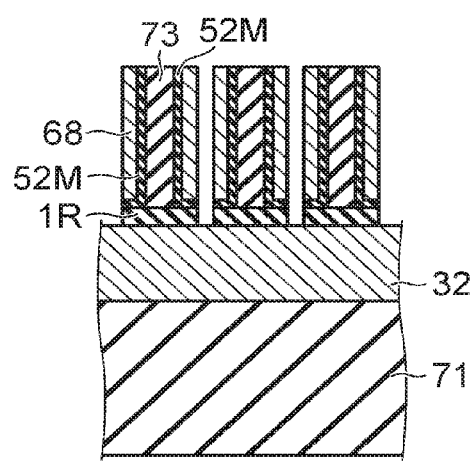

FIG. 23A, FIG. 23C and FIG. 23E correspond to schematic sectional views along line F1-F2 of FIG. 2. FIG. 23B, FIG. 23D and FIG. 23F correspond to schematic sectional views along line G1-G2 of FIG. 2.

Figure 24A:
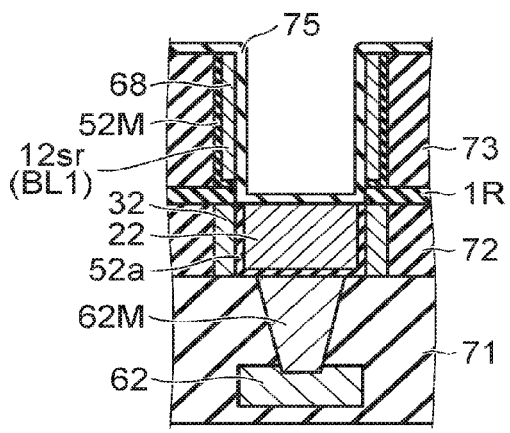
Figure 24B:
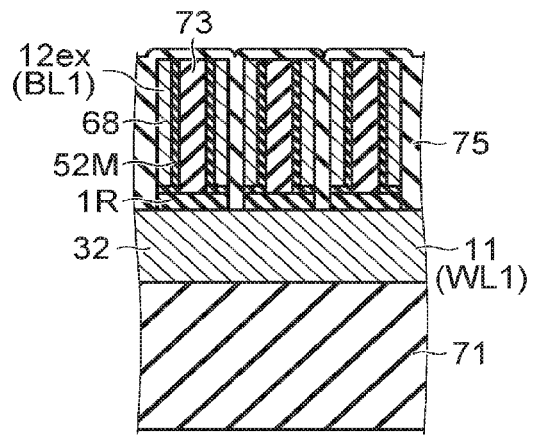
Figure 24C:
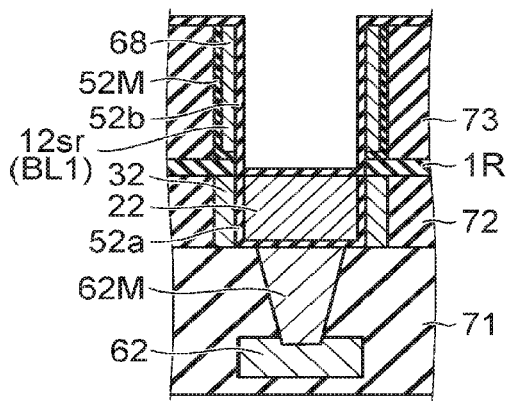
Figure 24D:
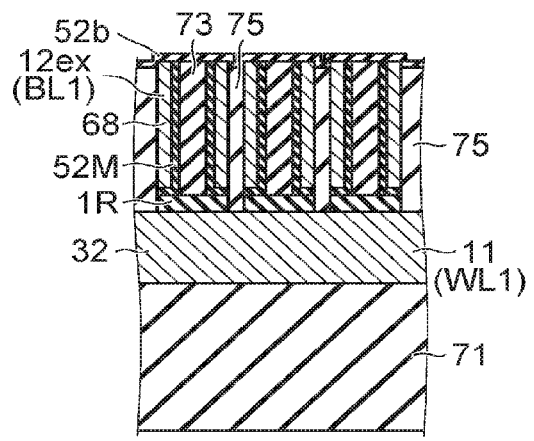
Figure 24E:
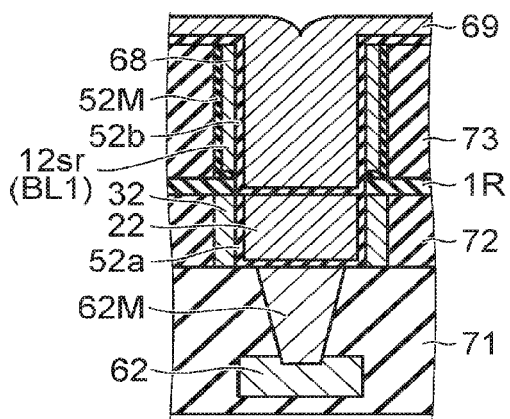
Figure 24F:
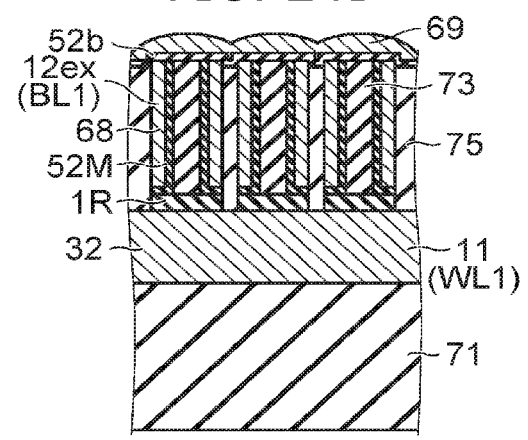

FIG. 24A, FIG. 24C and FIG. 24E correspond to schematic sectional views along line F1-F2 of FIG. 2. FIG. 24B, FIG. 24D and FIG. 24F correspond to schematic sectional views along line G1-G2 of FIG. 2.

Processes up to formation of an opening 82 (see FIG. 13D and FIG. 13E) are performed similarly to the method for manufacturing the semiconductor memory device 110.

As shown in FIG. 23A and FIG. 23B, a second metal containing layer 52M is formed on an insulating layer 73 and a first resistance change layer 1R.

As shown in FIG. 23C and FIG. 23D, a conductive member 68 is formed by depositing a conductive material on the second metal containing layer 52M.

As shown in FIG. 23E and FIG. 23F, the conductive member 68 is subjected to, for example, anisotropic etching. Hereby, a part of the conductive member 68 is remover, and the conductive member 68 on the side wall portion (insulating layer 73) remains, so that a second interconnect layer 12 is formed.

As shown in FIG. 24A and FIG. 24B, an insulating layer 75 is formed by depositing an insulating material on the insulating layer 73, the ion supply layer (second metal containing layer 52M), the second interconnect layer 12, a first layer second metal boundary layer 52a, the first resistance change layer 1R, a second extended connection part 22 and a first interconnect layer 11.

As shown in FIG. 24C and FIG. 24D, a part of the insulating layer 75 is removed. At this time, a part of the insulating layer 75 is not removed but remains.

A second layer second metal boundary layer 52b is formed by depositing a conductive material on the insulating layer 73, the second metal containing layer 52M, the second interconnect layer 12, the first layer second metal boundary layer 52a, the first resistance change layer 1R, the second extended connection part 22 and the insulating layer 75.

As shown in FIG. 24E and FIG. 24F, a conductive member 69 is formed by depositing a conductive material on the second layer second metal boundary layer 52b.

Thereafter, as described in FIGS. 22A and 22B, the conductive member 69 and the second layer second metal boundary layer 52b are subjected to, for example, CMP and are flattened.

According to the embodiment, it is possible to provide a semiconductor memory device and a method for manufacturing the same capable of improving operation stability.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
a first interconnect part;
a second interconnect part separated from the first interconnect part in a first direction;
a metal containing layer; and
a second interconnect connection part overlapping a part of the second interconnect part in the first direction, wherein
the first interconnect part includes
a first core part, and
a first interconnect layer including
a first surrounding region provided around the first core part, and
a first extended region connected to the first surrounding region and extending in a second direction crossing the first direction,
the second interconnect part includes
a second core part, and
a second interconnect layer including
a second surrounding region provided around the second core part,
a first surface facing the second core part,
a second surface separated from the first surface, and
a second extended region connected to the second surrounding region and extending in a third direction crossing the first direction and the second direction,
the second interconnect connection part includes
a second extended connection part overlapping a part of the first extended region in the third direction, overlapping the second core part in the first direction, and electrically connected to the second core part, and
a second extended surrounding part provided around the second extended connection part and containing a material contained in the first surrounding region,
the metal containing layer is provided between the second extended surrounding part and the second surrounding region and between the second extended region and the first interconnect layer, and
the metal containing layer is disposed on the second surface of the second interconnect layer.

2. The device according to claim 1, further comprising a first resistance change layer provided between the second extended region and the first extended region and between the second surrounding region and the second extended surrounding part.

3. The device according to claim 1, further comprising:
a first conductive part provided to be separated from the first core part;
a first conductive connection part provided between the first conductive part and the first core part;
a second conductive part provided to be separated from the second extended connection part; and
a second conductive connection part provided between the second conductive part and the second extended connection part.

4. The device according to claim 3, further comprising a first metal boundary layer provided between the first surrounding region and the first connection part and between the first core part and the first conductive connection part.

5. The device according to claim 3, further comprising:
a first layer second metal boundary layer provided between the second extended surrounding part and the second extended connection part and between the second extended connection part and the second conductive connection part; and
a second layer second metal boundary layer provided between the second surrounding region and the second core part and between the second core part and the second extended connection part.

6. The device according to claim 1, wherein
the first surrounding region is provided around the first core part,
the second surrounding region is provided around the second core part, and
the second extended surrounding part is provided around the second extended connection part.

7. The device according to claim 1, further comprising:
a third core part separated from the first core part and separated from the second core part;
a third interconnect layer including a third surrounding region provided around the third core part, and a third extended region provided to be separated from the second extended region in the first direction, connected to the third surrounding region and extending in the second direction;
a third extended connection part overlapping the third core part in the first direction;
a third extended surrounding part provided around the third extended connection part and containing the material contained in the first surrounding region;
a third extended intermediate connection part provided between the third core part and the third extended connection part, electrically connected to the third core part and electrically connected to the third extended connection part; and
a third extended intermediate surrounding part provided around the third extended intermediate connection part and containing a material contained in the second surrounding region.

8. The device according to claim 7, further comprising: a second resistance change layer provided between the third surrounding region and the third extended intermediate surrounding part and between the third interconnect layer and the second interconnect layer.

9. The device according to claim 7, further comprising:
a third conductive part provided to be separated from the third core part; and
a third conductive connection part provided between the third conductive part and the third core part.

10. The device according to claim 9, further comprising:
a first layer third metal boundary layer provided between the third extended surrounding part and the third extended connection part and between a third extended connection part and the third interconnect connection part;
a second layer third metal boundary layer provided between the third extended intermediate surrounding part and the third extended intermediate connection part and between the third extended intermediate connection part and the third extended connection part; and a third layer third metal boundary layer provided between the third surrounding region and the third core part and between the third core part and the third extended intermediate connection part.

11. The device according to claim 7, wherein the third surrounding region is provided around the third core part;

the third extended surrounding part is provided around the third extended connection part; and the third extended intermediate surrounding part is provided around the third extended intermediate connection part.

\* \* \* \* \*